United States Patent
Matsui

(10) Patent No.: US 6,778,120 B2
(45) Date of Patent: Aug. 17, 2004

(54) D/A CONVERTER CIRCUIT, AND PORTABLE TERMINAL DEVICE AND AUDIO DEVICE USING THE D/A CONVERTER CIRCUIT

(75) Inventor: Hirofumi Matsui, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/352,084

(22) Filed: Jan. 28, 2003

(65) Prior Publication Data

US 2003/0141998 A1 Jul. 31, 2003

(30) Foreign Application Priority Data

Jan. 28, 2002 (JP) ........................................ 2002-019138

(51) Int. Cl.[7] .............................. H03M 1/66; H03M 1/78
(52) U.S. Cl. ...................................... 341/145; 341/154
(58) Field of Search ................................. 341/145, 154

(56) References Cited

U.S. PATENT DOCUMENTS

| | | | | |
|---|---|---|---|---|
| 4,338,591 A | * | 7/1982 | Tuthill | 341/145 |
| 4,491,825 A | * | 1/1985 | Tuthill | 341/145 |
| 4,638,303 A | * | 1/1987 | Masuda et al. | 341/136 |
| 5,969,657 A | * | 10/1999 | Dempsey et al. | 341/145 |
| 6,469,647 B1 | * | 10/2002 | Kinugasa et al. | 341/145 |

FOREIGN PATENT DOCUMENTS

| | | |
|---|---|---|
| JP | 64-42924 | 2/1989 |
| JP | 2-13014 | 1/1990 |
| JP | 2-202227 | 8/1990 |
| JP | 3-77430 | 4/1991 |
| JP | 4-138725 | 5/1992 |
| JP | 2001177410 A * | 6/2001 ............ H03M/1/68 |

OTHER PUBLICATIONS

"Integated Analog–to–Digital and Digital–to–Analog Converter" pp 233–234, Kluwer Academic Publishers, 1994.

* cited by examiner

Primary Examiner—Howard L. Williams
(74) Attorney, Agent, or Firm—Birch, Stewart, Kolasch & Birch, LLP.

(57) ABSTRACT

A first D/A converter generates first and second reference voltages from digital data of upper m bit by using base reference voltages of these reference voltages. A controller outputs a control signal according to which of voltage levels of the first and second reference voltages is higher. An inversion controller outputs digital data of lower n bit as such to a second stage R-2R ladder resistor type D/A converter when judging that the first reference voltage is higher in voltage level than the second reference voltage, and outputs the digital data of the lower n bit to the second stage R-2R ladder resistor type D/A converter by inverting the digital data of the lower n bit when judging that the first reference voltage is lower in voltage level than the second reference voltage. The second stage R-2R ladder resistor type D/A converter uses the digital data inputted from the inversion controller to operate switches for switching the first and second reference voltages, and outputs an analog output voltage value corresponding to digital input data. On this account, it is possible to provide a D/A converter circuit of plural stages capable of easily ensuring uniformity and continuity of the output analog voltage value, and further capable of obtaining high D/A conversion accuracy.

10 Claims, 16 Drawing Sheets

FIG. 4(a)
FIG. 4(b)
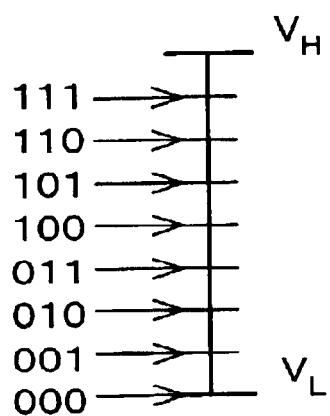
CONNECTION TO V2 ($V_L$)
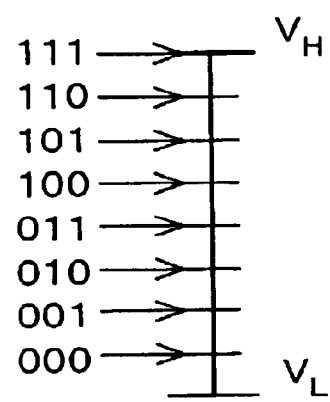
CONNECTION TO V1 ($V_H$)

IN THE CASE WHERE OFFCR=Gnd

IN THE CASE WHERE OFFCR=Vdd

IN THE CASE WHERE Gnd<OFFCR<Vdd

US 6,778,120 B2

1

D/A CONVERTER CIRCUIT, AND PORTABLE TERMINAL DEVICE AND AUDIO DEVICE USING THE D/A CONVERTER CIRCUIT

This nonprovisional application claims priority under 35 U.S.C. § 119(a) on Patent Application No. 2002-019138 filed in JAPAN on Jan. 28, 2002, which is herein incorporated by reference.

FIELD OF THE INVENTION

The present invention relates to a D/A converter circuit for converting an input digital signal into an analog signal, which adopts an R-2R ladder resistor-net, and in particular to a two-stage D/A converter circuit realizing resolution enhancement by two-stage D/A conversion operation.

BACKGROUND OF THE INVENTION

A D/A (digital-analog) converter having an R-2R ladder resistor-net is a circuit for converting an input digital signal into an analog signal and outputting the converted signal. For example, the D/A converter is made up of a resistor-net 71 including a resistor having resistance value of R and a resistor having resistance value of 2R (series resistance value of R and R), a group of switches 73 connected to the resistor-net 71 and an offset level control resistor 72, as with an R-2R ladder resister type D/A converter 70 shown in FIG. 8. FIG. 8 shows an example of 3-bit input, and digital input signals D3, D4 and D5 are respectively inputted to switches SW3, SW4 and SW5 making up the group of switches 73. The digital input signal D3 is MSB (Most Significant Bit) and the digital input signal D5 is LSB (Least Significant Bit). An offset terminal OFFCR is provided on an end of the offset level control resistor 72.

The following will more specifically explain operation principle of the R-2R ladder resistor type D/A converter 70 with reference to FIG. 8. The switches SW 3 through SW5 of the group of switches 73 control input to the resistor-net 71 according to the digital input (D3 through D5) by switching the input to Vdd when the digital input is HIGH, and switching the input to Gnd when the digital input is LOW. Thus, with the input of the digital input signals D3 through D5, an analog output voltage Aout can be expressed by the following equation:

$$Aout = \{(D3 \times 2^2 + D4 \times 2^1 + D5 \times 2^0)/2^3\} Vdd + \text{offset}$$

Here, Dn (n=3, 4, 5) is 0 or 1 (depending on the digital input code). The offset varies depending on the voltage inputted to the offset terminal OFFCR.

As shown in FIG. 9(a), when Gnd is inputted to the offset terminal OFFCR, the analog output becomes Gnd to (Vdd−1LSB), and as shown in FIG. 9(b), when Vdd is inputted to the offset terminal OFFCR, the analog output becomes (Gnd+1LSB) to Vdd. Further, as shown in FIG. 9(c), when the intermediate voltage value between Gnd and Vdd is inputted to the offset terminal OFFCR, the analog output becomes the intermediate value between FIG. 9(a) and FIG. 9(b).

The R-2R ladder resistor type D/A converter 70 outputs the analog output Aout according to the foregoing equation when the ratio of R to 2R is accurately 1:2. However, as it is clearly shown in FIG. 8, due to ON resistance of the switches SW3 through SW5, 2R actually becomes 2R+α (α is ON resistance of the switches). Therefore, in order to compensate the ratio of R side to 2R side to be 1:2, for example, Japanese Laid-Open Patent Application Tokukai-

2 sho 64-042924/1989 (published on Feb. 15, 1989), Japanese Laid-Open Patent Application Tokukaihei 02-013014/1990 (published on Jan. 17, 1990), Japanese Laid-Open Patent Application Tokukaihei 02-202227/1990 (published on Aug. 10, 1990), Japanese Laid-Open Patent Application Tokukaihei 04-138725/1992 (published on May 13, 1992) or some other publications disclose an arrangement for always turning on switches also in the R side. Note that, it is also possible to provide the resistance value of 2R side by originally subtracting by ON resistance of the switches so as to compensate the ratio of 1:2. Further, Japanese Laid-Open Patent Application Tokukaihei 03-77430/1991 (published on Apr. 3, 1991) discloses an arrangement for switching the voltage inputted to the input terminal of the offset level control resistor between the upper limit voltage and the lower limit voltage inputted to the input terminal of 2R side. This arrangement realizes a D/A converter with high resolution and high accuracy even without improving accuracy of resistance element.

Here, as the R-2R ladder resistor type D/A converter 70 in FIG. 8 reveals, in the R-2R ladder resistor type D/A converter, the required number of the unit resister R is calculated as 3n+1 with respect to the bit number n of the digital input signal. Accordingly, the R-2R ladder resistor type D/A converter requires smaller area for resistors compared to a binary resistor type D/A converter (the number of unit resistor is $2^n - 1$ with respect to the bit number n), and besides, a D/A converter with high performance can be realized by ensuring only the relative accuracy for the accuracy of the resistor even without ensuring the absolute value. Thus, this mode is advantageous when using as an IC.

However, the relative accuracy between resistors used for the ladder resistor-net in the R-2R ladder resistor type D/A converter is merely about 0.05% without trimming. For this reason, it is difficult to constitute a D/A converter of 10 bits or above only by the R-2R ladder resistor type D/A converter.

In order to increase resolution without costly trimming, two-stage D/A conversion (plural-stages in general) may be performed as with the two-stage D/A converter circuit 90 shown in FIG. 10. The two-stage D/A converter circuit 90 includes a first stage D/A converter 91, a second stage R-2R ladder resistor type D/A converter 92, a latch circuit 93 and a reference voltage generation circuit 94.

The latch circuit 93 latches digital input data Din in accordance with a clock signal CK, and upper m bit of the latched digital input data Din is inputted to the first stage D/A converter 91 performing first D/A conversion of the two-stage conversion. The first stage D/A converter 91 generates an analog output voltage according to the upper m bit and an analog output voltage according to digital input of the upper m bit+1 from reference voltages VH and VL inputted from the reference voltage generation circuit 94, and then outputs the voltages respectively as a reference voltages $V_L$ and a reference voltage $V_H$.

Further, lower n bit of the latched digital input data Din is inputted to the second stage R-2R ladder resistor type D/A converter 92 performing second D/A conversion of the two-stage conversion. Further, the second stage R-2R ladder resistor type D/A converter 92 generates a final analog signal Aout of the digital input data Din based on the reference voltages $V_L$ and $V_H$ inputted from the first stage D/A converter 91, and the lower n bit, then outputs the analog signal Aout. The second stage R-2R ladder resistor type D/A converter 92 is made of the R-2R ladder resistor type D/A converter shown in FIG. 8, and the reference voltage $V_H$, and the reference voltage $V_L$ are inputted respectively instead of Vdd and GND of FIG. 8.

The following will explain a resistor string type (also referred to as voltage potentiometer type) D/A converter 91a shown in FIG. 11 as an example of the first stage D/A converter 91. FIG. 11 shows an example in which the upper bit of the digital input data Din is 3 bits, i.e., the input and output is carried out in eight-stages. The resistor string type D/A converter 91a includes a resistor string 101, reference voltage switches 102 and 103, an upper limit reference voltage $V_H$ buffer amp 104 and a lower limit reference voltage $V_L$ buffer amp 105.

The resistor string 101 is a voltage dividing circuit made up of resistors r0 through r7 connected in series, and the reference voltage $V_H$ is inputted to an end of the resistor r0 side and the reference voltage $V_L$ is inputted to an end of the resistor r7 side. The reference voltage switch 102 includes switches SH0 through SH7. These switches are respectively used for sequentially inputting a voltage in an end of reference voltage $V_H$ input side of the resistors r0 through r7 to the upper limit reference voltage $V_H$ buffer amp 104. Further, the reference voltage switch 103 includes switches SL0 through SL7. These switches are respectively used for sequentially inputting a voltage in an end of reference voltage $V_L$ input side of the resistors r0 through r7 to the lower limit reference voltage $V_L$ buffer amp 105. The respective switches are opened/closed by a control signal according to the result of decoding of the upper 3 bits by a decoder (see FIG. 10) inside of the first stage D/A converter 91.

The upper limit reference voltage $V_H$ buffer amp 104 outputs a voltage inputted via one of the switches included in the reference voltage switch 102 as the upper limit reference voltage $V_H$. Further, the lower limit reference voltage $V_L$ buffer amp 105 outputs a voltage inputted via one of the switches included in the reference voltage switch 103 as the lower limit reference voltage $V_L$.

In the resistor string type D/A converter 91a having the foregoing arrangement, when the upper 3 bits of the digital input data Din are "111", for example, the switches SH0 and SL0 are turned on, and the respective voltages in both ends of the resistor r0 are outputted as the upper limit reference voltage $V_H$ and the lower limit reference voltage $V_L$. Further, when the upper 3 bits are "110", the switches SH1 and SL1 are turned on, and the respective voltages in both ends of the resistor r1 are outputted as the upper limit reference voltage $V_H$ and the lower limit reference voltage $V_L$. For the rest, the upper limit reference voltage $V_H$ and the lower limit reference voltage $V_L$ corresponding to each resistor are outputted by operating those switches in accordance with the digital inputs down to the upper 3 bits of "000".

However, respective output voltages from the upper limit reference voltage $V_H$ buffer amp 104 and the lower limit reference voltage $V_L$ buffer amp 105 used in this case generally include offset component due to dispersion of the input transistor of the buffer amp. Therefore, as shown in FIG. 12, when the upper bit is switched in the resistor string type D/A converter 91a, a discontinuity may occur at a border of the range of analog output voltage. Accordingly, for the use requiring uniformity and continuity, a resistor string type D/A converter 91b shown in FIG. 13 designed for solving the foregoing problem by having a different type of switch connection is used.

The resistor string type D/A converter 91b shown in FIG. 13 includes a resistor string 111, a reference voltage switch 112, a reference voltage $V_H$ buffer amp 113 and a reference voltage $V_L$ buffer amp 114. The resistor string 111 has the same configuration as that of the resistor string 101 of FIG. 11. The reference voltage switch 112 includes switches SH0 through SH7 and switches SL0 through SL7, and a single switch operates as the switch SLk and the Switch SH (k+1) (k=0, 1, 2 . . . 6). The switches SH0, SH2 (SL1), SH4 (SL3), and SH6 (SL5) respectively operate to sequentially input a voltage in an end of reference voltage $V_H$ input side of the resistors r0, r2, r4, r6 to the reference voltage $V_H$ buffer amp 113, and, the switch SL7 operates to input a voltage in an end of reference voltage $V_L$ input side of the resistor r7 to the reference voltage $V_H$ buffer amp 113. Meanwhile, the switches SH1 (SL0), SH3 (SL2), SH5 (SL4), and SH7 (SL6) respectively operate to sequentially input a voltage in an end of input side of reference voltage $V_H$ of the resistors r1, r3, r5, r7 to the reference voltage $V_L$ buffer amp 114. The respective switches are opened/closed by a control signal according to the result of decoding of the upper 3 bits by a decoder (see FIG. 14) inside of the resistor string type D/A converter 91b.

The reference voltage $V_H$ buffer amp 113 outputs a voltage inputted via the reference voltage switch 112 as the reference voltage $V_H$, and the reference voltage $V_L$ buffer amp 114 outputs a voltage inputted via the reference voltage switch 112 as the reference voltage $V_L$.

In the resistor string type D/A converter 91b having the foregoing arrangement, when the upper 3 bits of the digital input data Din are "111", for example, the switches SH0 and SL0 (SH1) are turned on so as to output the respective voltages in both ends of the resistor r0 as the reference voltage $V_H$ and the reference voltage $V_L$. Further, when the upper 3 bits are "110", the switches SH1 (SL0) and SL1 (SH2) are turned on so as to output the respective voltages in both ends of the resistor r1 as the reference voltage $V_H$ and the reference voltage $V_L$. For the rest, the reference voltage $V_H$ and the reference voltage $V_L$ corresponding to each resistor are outputted by operating those switches in accordance with the digital inputs down to the upper 3 bits of "000". As a result, the discontinuity does not occur at the border of the range of analog output voltage when the upper bit is switched in the resistor string type D/A converter 91b.

Here, the resistor string type D/A converter 91b differs from the resistor string type D/A converter 91a of FIG. 11 in the following point. In the resistor string type D/A converter 91a, the reference voltage $V_H$ is always outputted with higher voltage level than the reference voltage VL; in contrast, in the resistor string type D/A converter 91b, the voltage levels of the reference voltage $V_H$ and the reference voltage $V_L$ alternately become high or low according to the digital input. Therefore, the two-stage D/A converter using the resistor string type D/A converter 91b of FIG. 13 additionally includes an exchanger 122 as with the two-stage D/A converter circuit 121 shown in FIG. 14.

The exchanger 122 outputs the reference voltage $V_H$ and the reference voltage $V_L$ to the second stage R-2R ladder resistor type D/A converter 92 respectively as the upper limit reference voltage $V_{HH}$ and the lower limit reference voltage $V_{LL}$ when the reference voltage $V_H$ is higher in the voltage level than the reference voltage $V_L$. Further, when the reference voltage $V_H$ is lower in the voltage level than the reference voltage $V_L$ for the reason above, the exchanger 122 outputs the reference voltage $V_L$ as the upper limit reference voltage $V_{HH}$, and outputs the reference voltage $V_H$ as the lower limit reference voltage $V_{LL}$ so as to use these voltages as the reference voltage of the second stage R-2R ladder resistor type D/A converter 92. The judgments of those voltage levels and whether or not the reference voltage levels are actually swapped are controlled by a control signal CE showing the voltage level relation between the reference voltage $V_H$ and the reference voltage $V_L$. The control signal CE is generated as a result of decoding of the upper 3 bits by the resistor string type D/A converter 91b.

The exchanger 122 is generally made up of some switches such as the switches SW11, SW12, SW13 and SW 14 shown in FIG. 15(a). In FIG. 15(a), the control signal CE is inputted to the switches SW11 and SW14, and an inversion signal CEb of the control signal CE is inputted to the switches SW12 and SW13. These switches are controlled so that the switches 12 and 13 become OFF (closed)-state when the switches SW11 and SW14 are in ON (opened)-state, and the switches 12 and 13 become ON-state when the switches SW11 and SW14 are in OFF-state. Further, the inversion signal CEb is generated after the control signal CE passes through the inverter 131, as shown in FIG. 15(b).

For example, '"INTEGRATED ANALOG-TO-DIGITAL AND DIGITAL-TO-ANALOG CONVERTERS", pp233–234, Kluwer Academic Publishers, 1994' describes the foregoing two-stage D/A converter circuit in which the voltage levels of the reference voltage $V_H$ and the reference voltage $V_L$ alternately become high or low so that the reference voltages $V_H$ and $V_L$ are outputted as the reference voltages of the second stage D/A converter.

SUMMARY OF THE INVENTION

Incidentally, in the described two-stage D/A converter circuit, i.e., the two-stage D/A converter circuit using the R-2R ladder resistor type D/A converter as the second stage converter, since the exchanger includes a plurality of switches, ON resistance of the respective switches may vary due to manufacturing variation of the switches. Thus, even when the reference voltage $V_H$ has a uniform voltage level, output voltage level of the exchanger may vary depending on which switch is in ON-state, for example, the output voltage level respectively differ in the case of outputting the voltage as an upper limit reference voltage $V_{HH}$ via SW 11 of FIG. 15(a), and in the case of outputting the voltage as a lower limit reference voltage $V_{LL}$ via SW12.

Further, due to ON resistance ($\alpha$) of the switches of the exchanger, resistance value of 2R side in the second stage R-2R ladder resistor type D/A converter becomes 2R+$\alpha$, and therefore resistance ratio of R to 2R fluctuates. This may cause inaccurate operation of the D/A converter, depending on the value of $\alpha$.

As described, a conventional two-stage D/A converter circuit could cause a problem of degrading D/A conversion accuracy of the second stage n bit R-2R ladder resistor type D/A converter, which causes degradation of D/A conversion accuracy of the whole two-stage D/A converter circuit. Accordingly, the conventional two-stage D/A converter circuit causes a problem of a difficulty in ensuring uniformity and continuity of output analog voltage value.

An object of the present invention is to provide a D/A converter circuit carrying out (m+n) bits D/A conversion by generating two kinds of reference voltages, which are used in a second n bit R-2R ladder resistor type D/A converter, by a m bit D/A converter, and capable of easily ensuring uniformity and continuity, and further capable of obtaining high D/A conversion accuracy; and also to provide a portable terminal device and an audio device having the D/A converter circuit.

In order to attain the foregoing objects, the D/A converter circuit of the present invention includes: a first D/A converter for generating a first reference voltage and a second reference voltage different to each other in voltage level according to upper m bit of digital input data of (m+n) bits; a second D/A converter of R-2R ladder resistor type for converting the digital input data to an analog voltage value by using information of lower n bit of the digital input data and the first and second reference voltages so that the analog voltage value is within a range whose upper limit is a higher voltage level of the first reference voltage and the second reference voltage, and whose lower limit is a lower voltage level of the first reference voltage and the second reference voltage, the first reference voltage being supplied to respective input terminals on digital data input side of a ladder resistor-net in the second D/A converter when each bit of digital data of the lower n bit inputted to the second D/A converter has a first value, and the second reference voltage being inputted to the respective input terminals on the digital data input side of the ladder resistor-net in the second D/A converter when each bit of the digital data of the lower n bit supplied to the second D/A converter has a second value; controlling means for generating a control signal according to which of voltage levels of the first reference voltage and the second reference voltage is higher; and inverting means for inputting the digital data of the lower n bit as such to the second D/A converter when the control signal shows that the first reference voltage is higher in voltage level than the second reference voltage, and inputting the digital data of the lower n bit to the second D/A converter by exchanging the first value and the second value of the digital data of the lower n bit when the control signal shows that the first reference voltage is lower in voltage level than the second reference voltage.

With the foregoing arrangement, the provided first D/A converter generates the first and second reference voltages of different voltage levels that are according to the upper m bit of the digital input data of (m+n) bits. The first D/A converter inputs the first and second voltages to the second D/A converter of an R-2R ladder resistor type. The controlling means generates a control signal according to which of voltage levels of the first reference voltage and the second reference voltage is higher. Further, the inverting means inputs the digital data of the lower n bit as such to the second D/A converter when the control signal shows that the first reference voltage is higher in voltage level than the second reference voltage, and inputs the digital data of the lower n bit to the second D/A converter by exchanging the first value and the second value of the digital data of the lower n bit when the control signal shows that the first reference voltage is lower in voltage level than the second reference voltage.

With the foregoing operation by the inverting means, when the digital data is supplied to respective input terminals on digital data input side of a ladder resistor-net in the second D/A converter by the inverting means, the reference voltage of higher voltage level is supplied to respective input terminals on digital data input side of a ladder resistor-net in the second D/A converter when each bit of digital data of the lower n bit inputted to the second D/A converter has a first value, and the second reference voltage is inputted to the respective input terminals on the digital data input side of the ladder resistor-net in the second D/A converter when the bit of the digital data of the lower n bit supplied to the second D/A converter has a second value regardless of which of voltage levels of the first and second reference voltages is higher. Further, the second D/A converter uses information of lower n bit, i.e., the digital data inputted from the inverting means and the first and second reference voltages so as to convert the digital data into an analog voltage value so that the analog voltage value is within a range whose upper limit is a higher voltage level of the first reference voltage and the second reference voltage, and whose lower limit is a lower voltage level of the first reference voltage and the second reference voltage.

On this account, D/A conversion can be carried out by using the second D/A converter without using such as an exchanger even with the first D/A converter in which the voltage levels of the first reference voltage and the second reference voltage become alternately high or low according to the upper m bit. Consequently, higher D/A conversion accuracy can be obtained since the exchanger including a plurality of switches is not required.

As a result, it is possible to provide a D/A converter circuit carrying out (m+n) bits D/A conversion by generating two kinds of reference voltages, which are used in a second n bit R-2R ladder resistor type D/A converter, by a m bit D/A converter, and also capable of easily ensuring uniformity and continuity of the output analog voltage value, and further capable of obtaining high D/A conversion accuracy.

Further, in order to attain the foregoing objects, a portable terminal device of the present invention includes one of the described D/A converter circuits.

With the foregoing arrangement, uniformity and continuity of the output analog voltage value can be ensured and also high D/A conversion accuracy can be obtained at a portion carrying out D/A conversion, such as a control voltage generation circuit at an Analog Front End in a portable terminal device.

Further, the foregoing D/A converter circuit 10 can also be used as a volume control circuit of an audio device. On this account, high D/A conversion accuracy can be obtained which ensures uniformity and continuity of the output analog voltage value at a portion carrying out D/A conversion in the volume control circuit.

Further, in order to attain the foregoing objects, an audio device of the present invention includes one of the described D/A converter circuits.

With the foregoing arrangement, uniformity and continuity of the output analog voltage value can be ensured and also high D/A conversion accuracy can be obtained at a portion at a portion carrying out D/A conversion, such as a volume control circuit.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 4(a) is a drawing illustrating an example of correlation between input and output of the second stage R-2R ladder resistor type D/A converter of FIG. 2, and also showing an example of a range of analog output voltage with respect to lower bit of digital input when upper bit of digital input satisfies a certain condition.

FIG. 4(b) is a drawing illustrating an example of correlation between input and output of the second stage R-2R ladder resistor type D/A converter of FIG. 2, and also showing an example of a range of analog output voltage with respect to lower bit of digital input when upper bit of digital input satisfies another certain condition.

DESCRIPTION OF THE EMBODIMENTS

The following will explain an embodiment of the present invention with reference to FIGS. 1 through 7(b), and FIG. 16.

Figure 1:
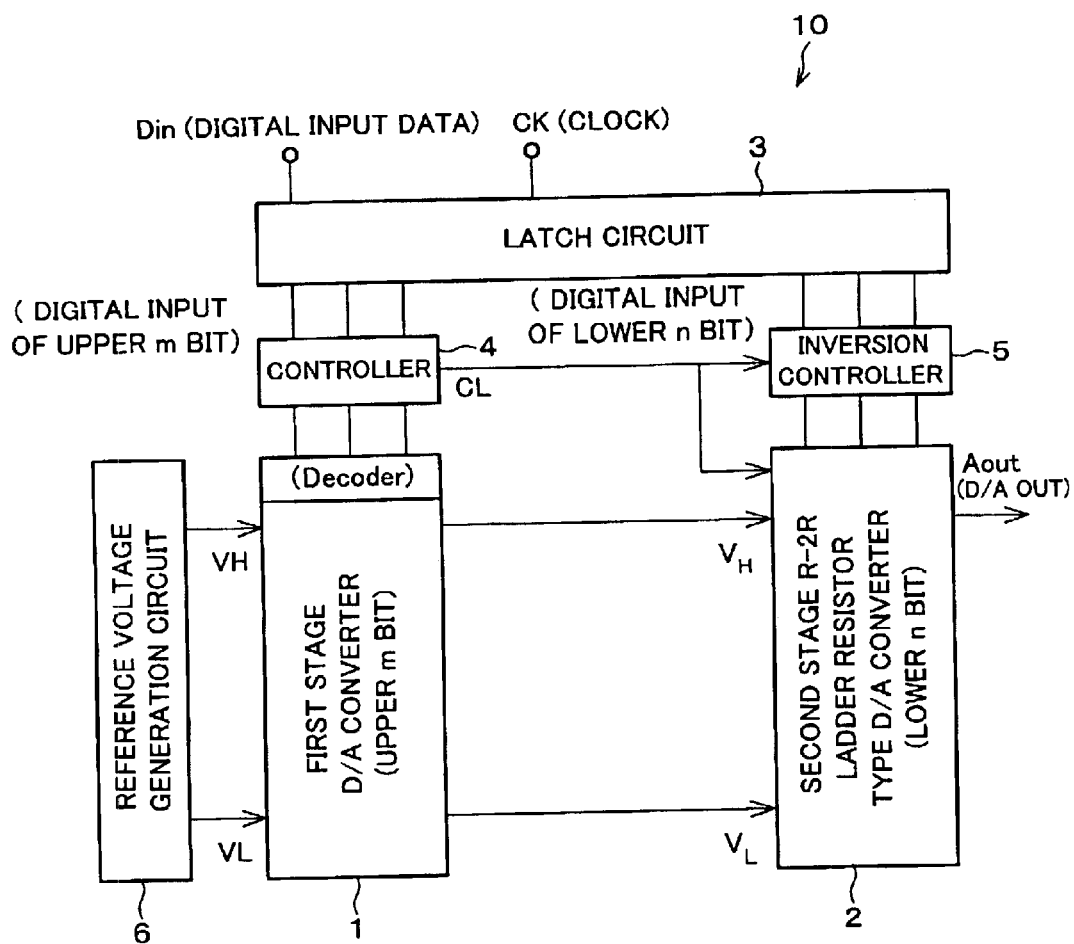
FIG. 1 is a block diagram showing an arrangement of a D/A converter according to an embodiment of the present invention.
Figure 14:
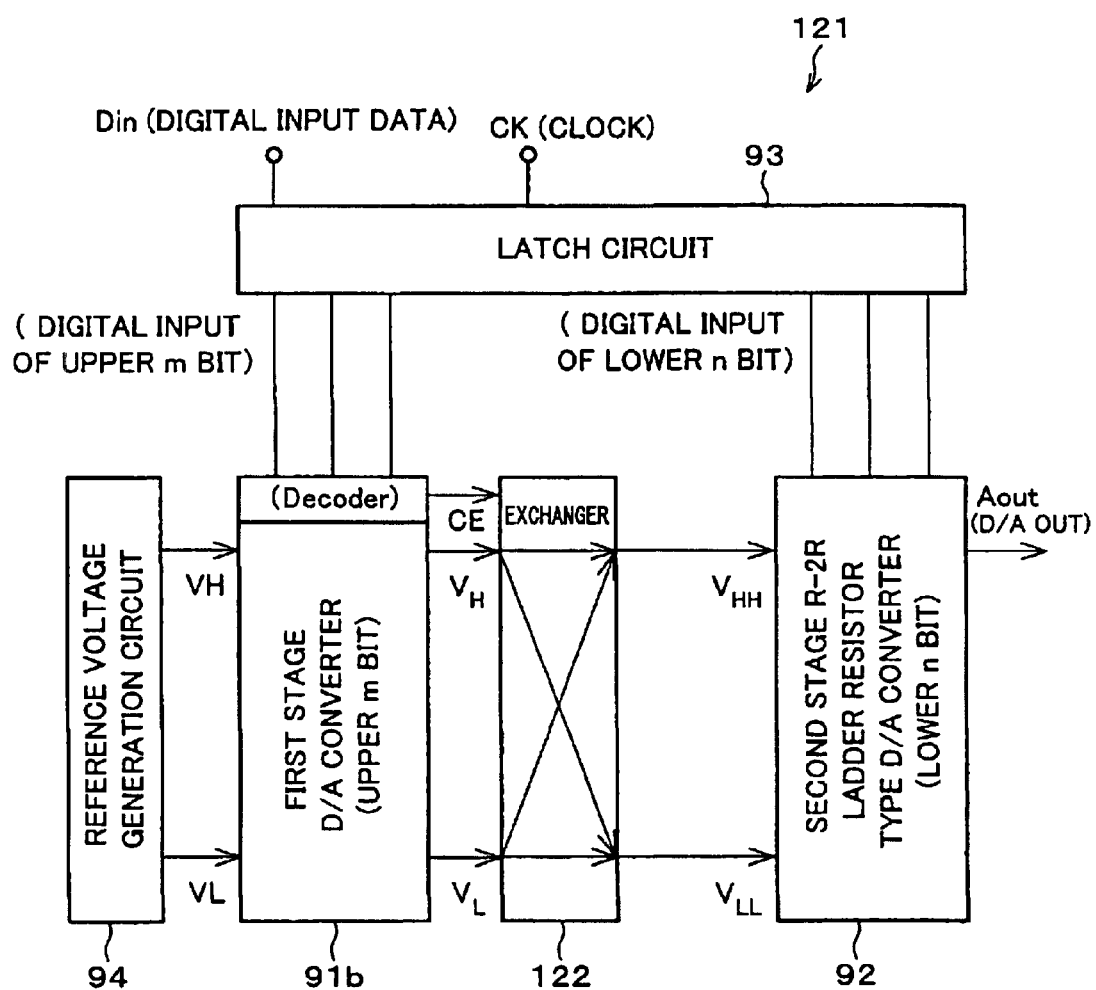
FIG. 14 is a block diagram showing an arrangement of a conventional two-stage D/A converter including the first stage D/A converter of FIG. 13.
Figure 15A:
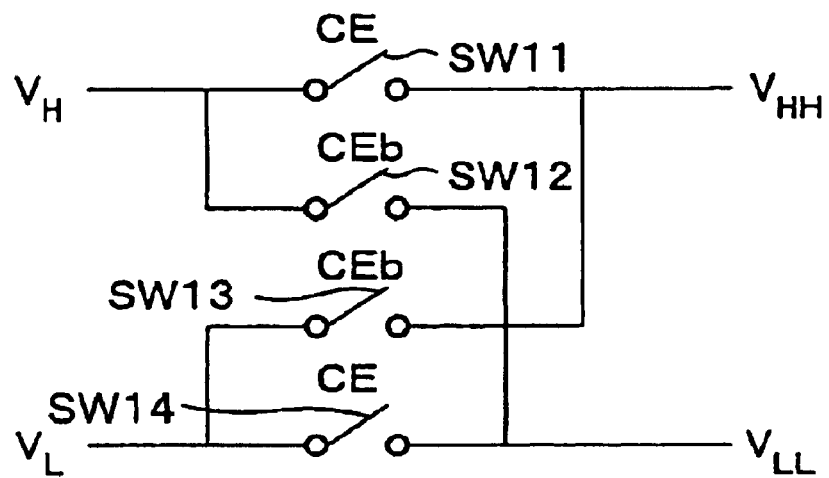
FIG. 15(a) is a circuit diagram showing a circuit used for the case of providing an exchanger in the two-stage D/A converter of FIG. 14, and also showing switches included in the exchanger.
Figure 15B:
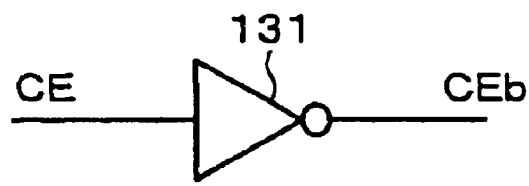
FIG. 15(b) is a circuit diagram showing a circuit used for the case of providing an exchanger in the two stage D/A converter of FIG. 14, and also showing an inverter for generating an inversion signal supplied to the switch.

FIG. 1 shows an arrangement of a D/A converter 10 according to the present embodiment. The D/A converter 10 is a two-stage (m+n) bits D/A converter including a first stage D/A converter 1, a second stage R-2R ladder resistor type D/A converter 2, a latch circuit 3, a controller 4, an inversion controller 5 and a reference voltage generation circuit 6. However, this converter does not include an exchanger, such as the one shown in FIG. 14, which exchanges a reference voltage with a lower voltage level to a lower limit reference voltage, and exchanges a reference voltage with a higher voltage level to an upper limit reference voltage; and reference voltages $V_H$ and $V_L$ outputted from the first stage D/A converter 1 are inputted as the reference voltages $V_H$ and $V_L$ of the second stage R-2R ladder resistor type D/A converter 2.

Note that, the number of upper bit m and the number of lower bit n of digital input data Din of (m+n) bits are not particularity specified; however, the present embodiment explains an example where m and n are both 3 bits.

The first stage D/A converter (a first D/A converter) 1 generates first and second reference voltages respectively having different voltage levels according to the upper m bit of the digital input data Din. Here, in order to obtain high resolution (10 bits or more, for example), and also to ensure uniformity and continuity of the D/A converter 10, the present embodiment adopts an arrangement of the first stage D/A converter 1 which can prevent the discontinuity at the border of the range of analog output voltage when the upper m bit is switched. Therefore, a resistor string type D/A converter having the arrangement shown in FIG. 16 is adopted.

Figure 16:
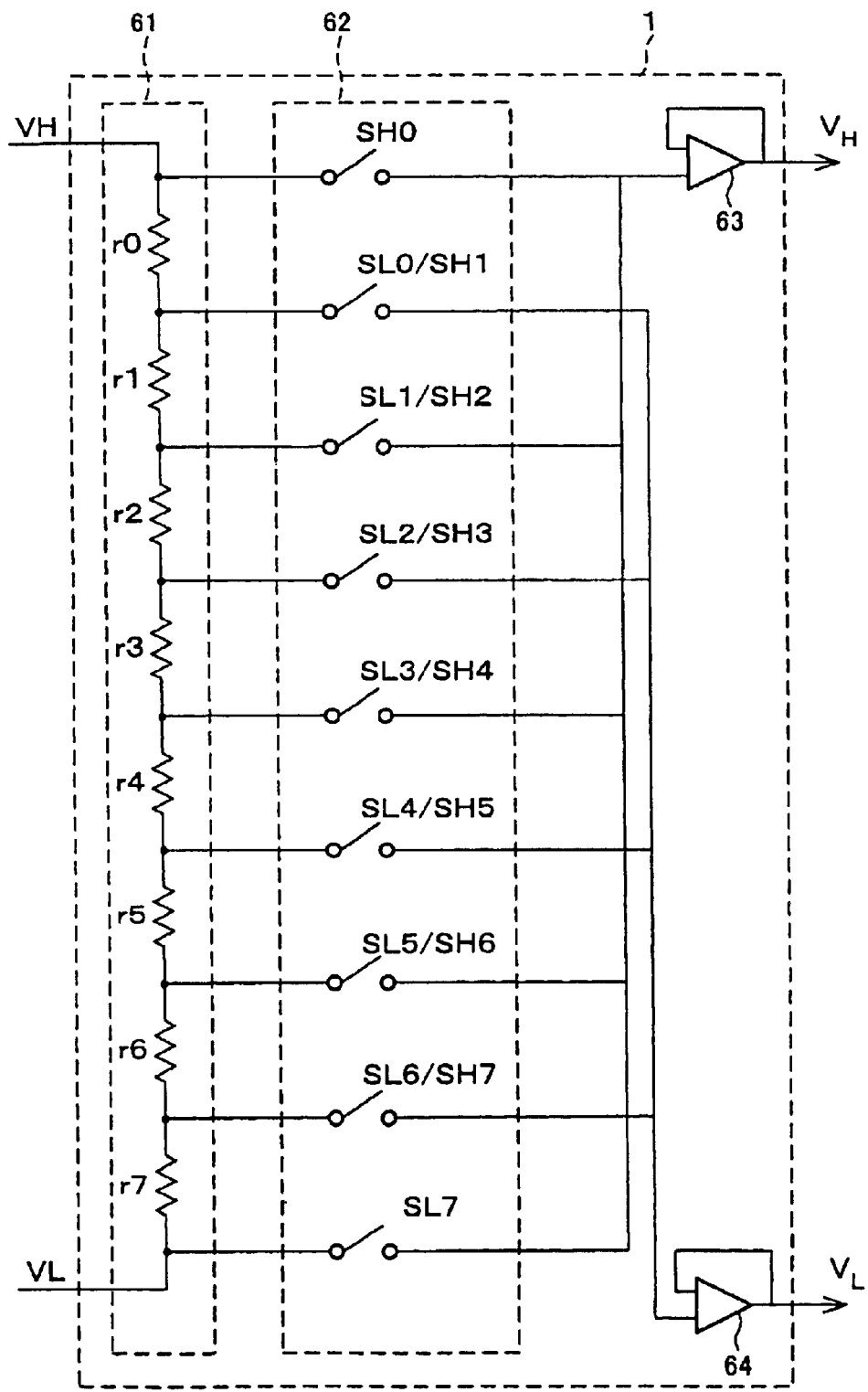
FIG. 16 shows the embodiment above, and is a circuit diagram showing an arrangement example of the first stage D/A converter included in the D/A converter of FIG. 1.

More specifically, as shown in FIG. 16, the first stage D/A converter 1 as the resistor string type D/A converter includes a resistor string 61, a reference voltage switch 62, a reference voltage $V_H$ buffer amp 63, and a reference voltage $V_L$ buffer amp 64. The resistor string 61 is a voltage dividing circuit made up of resistors r0 through r7 connected in series, and the reference voltage $V_H$ is inputted to an end of the resistor r0 side and the reference voltage VL is inputted to an end of the resistor r7 side. The reference voltage switch 62 includes switches SH0 through SH7 and switches SL0 through SL7, and a single switch operates as the switch SLk and the switch SH (k+1) (k=0, 1, 2 . . . 6). These switches SH0, SH2 (SL1), SH4 (SL3), and SH6 (SL5) respectively operate to sequentially input a voltage in an end of reference voltage VH input side of the resistors r0, r2, r4, r6 to the reference voltage $V_H$ buffer amp 63, and, the switch SL7 operates to input a voltage in an end of reference voltage VL input side of the resistor r7 to the reference voltage $V_H$ buffer amp 63. Meanwhile, the switches SH1 (SL0), SH3 (SL2), SH5 (SL4), and SH7 (SL6) are respectively used for sequentially inputting a voltage in an end of reference voltage VH input side of the resistors r1, r3, r5, r7 to the reference voltage $V_L$ buffer amp 64. The respective switches are opened/closed by a control signal according to the result of decoding of the upper 3 bits by a decoder (see FIG. 1) inside of the first stage D/A converter 1 (resistor string type D/A converter).

Further, the reference voltage $V_H$ buffer amp 63 outputs a voltage has been inputted via the reference voltage switch 62 as the reference voltage $V_H$ (first reference voltage), and the reference voltage $V_L$ buffer amp 64 outputs a voltage has been inputted via the reference voltage switch 62 as the reference voltage $V_L$ (second reference voltage).

The second stage R-2R ladder resistor type D/A converter 2 will be described later.

The latch circuit 3 latches digital input data Din in accordance with a clock signal CK, and outputs digital data of upper m bit of the latched digital input data Din, which is inputted to the digital data to the controller 4, and also outputs digital data of lower n bit, which is inputted to the digital data to the inversion controller 5.

The controller (controlling means) 4 judges voltage level relation between the reference voltage $V_H$ and the reference voltage $V_L$ based on the digital data of upper m bit inputted from the latch circuit 3, then generates a control signal CL according to the voltage level relation thus judged and then outputs the control signal CL. When the voltage level of the reference voltage $V_H$ is higher than that of the reference voltage $V_L$ ($V_H > V_L$), the control signal CL will be HIGH, and when the voltage level of the reference voltage $V_H$ is lower than that of the reference voltage $V_L$ ($V_H < V_L$), the control signal CL will be LOW. The outputted control signal CL is then inputted to the inversion controller 5 and the second stage R-2R ladder resistor type D/A converter 2. Further, the controller 4 outputs the digital data of upper m bit has been supplied thereto as such, then inputs the digital data to the first stage D/A converter 1.

The inversion controller (inverting means) 5 inputs the digital data of lower n bit as such to the second stage R-2R ladder resistor type D/A converter 2 when the control signal CL is HIGH. On the other hand, when the control signal CL is LOW, the inversion controller 5 inputs the digital data to the second stage R-2R ladder resistor type D/A converter 2 by exchanging a first value and a second value of the digital data of lower n bit. Here, the first value is 1 and the second value is 0.

The reference voltage generation circuit (base reference voltage generating means) 6 generates and outputs reference voltages VH and VL by using a band gap reference circuit or the like. The reference voltages VH and VL are base reference voltages to create the reference voltage $V_H$ and the reference voltage $V_L$ by the first stage D/A converter 1. The reference voltage generation circuit 6 inputs the created reference voltages VH and VL to the first D/A converter 1.

Note that, the present embodiment explains an example of generating the reference voltages VH and VL by the reference voltage generation circuit 6 provided in the D/A converter 10; however, the present invention may also adopt an arrangement of providing respective input terminals of the reference voltages VH and VL instead of the reference voltage generation circuit 6 so as to supply those reference voltages from outside of the D/A converter 10.

The second stage R-2R ladder resistor type D/A converter (second D/A converter) 2 outputs the digital input data Din after converting the digital data to an analog voltage value by using information of lower n bit of the digital input data Din and the reference voltages $V_H$ and $V_L$ so that the analog voltage value is within a range between an upper limit with higher voltage level between the reference voltage $V_H$ and the reference voltage $V_L$, and a lower limit with lower voltage level between the reference voltage $V_H$ and the reference voltage $V_L$. The information of lower n bit is digital data inputted from the inversion controller 5, and which will be the original digital data of lower n bit when the control signal CL is HIGH, and will be digital data in which 1 and 0 of the lower n bit are exchanged when the control signal CL is LOW.

Figure 2:
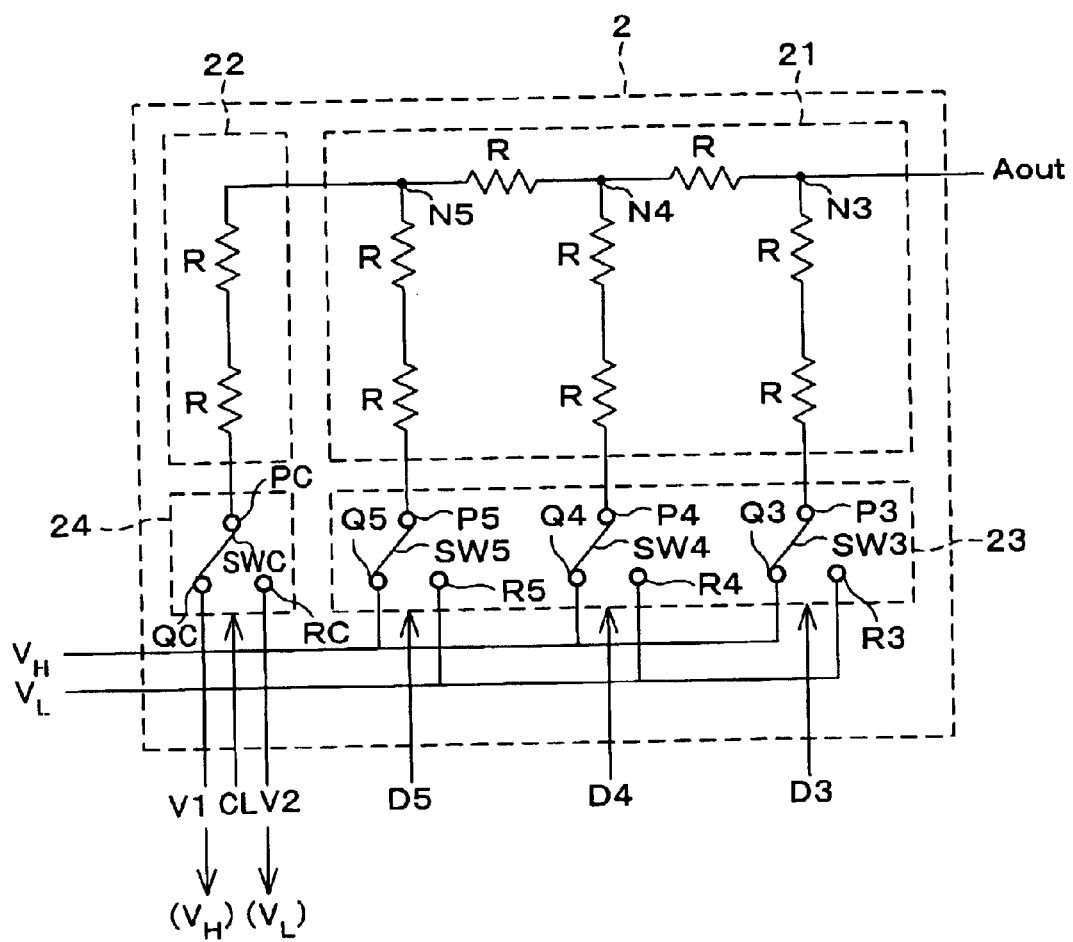
FIG. 2 is a circuit diagram showing an arrangement of a second stage R-2R ladder resistor type D/A converter included in the D/A converter of FIG. 1.

As shown in FIG. 2, the second stage R-2R ladder resistor type D/A converter 2 includes a resistor-net 21, an offset level control resistor 22, a group of switches 23, and a connection switching section 24. Further, the resistor-net 21 and the offset level control resistor 22 make up a ladder resistor-net.

The resistor-net 21 includes eight resisters respectively having resistance value of R connected in a form of a ladder, nodes N3, N4 and N5 of the foregoing ladder connection corresponding to the number n of lower bit, an input terminal P3 on the input side of the first bit of the lower n bit (the 4th bit of the digital input data Din), an input terminal P4 on the input side of the 5th bit of the digital input data Din, an input terminal P5 on the input side of the last bit of the lower n bit (the 6th bit of the digital input data Din).

More specifically, the nodes N3 and N4 are connected via the resistor with resistance value of R, and the nodes N4 and N5 are connected via the resistor with resistance value of R. Further, the resisters with resistance value of 2R (series resisters made up of two resisters with resistance value of R) respectively connect the node 3 and the input terminal P3, the node 4 and the input terminal P4, and the node 5 and the input terminal P5. Further, the node N3 outputs an analog output voltage Aout corresponding to the digital input data Din.

Meanwhile, the offset level control resistor 22 has two resistors with resistance value of R and an input terminal PC to which an offset level control voltage is inputted. The node N5 and the input terminal PC are connected to each other via the resistor with resistance value of 2R (the series resisters made up of two resisters with resistance value of R).

Further, the group of switches 23 includes switches SW3, SW4 and SW5. The switch SW3 operates to carry out connection and disconnection respectively between a connection terminal Q3 to which the reference voltage $V_H$ is applied and the node P3, and between a connection terminal R3 to which the reference voltage $V_L$ is applied and the node P3. The switch SW4 operates to carry out connection and disconnection respectively between a connection terminal Q4 to which the reference voltage $V_H$ is applied and the node P4, and between a connection terminal R4 to which the reference voltage $V_L$ is applied and the node P4. The switch SW5 operates to carry out connection and disconnection respectively between a connection terminal Q5 to which the reference voltage $V_H$ is applied and the node P5, and between a connection terminal R5 to which the reference voltage $V_L$ is applied and the node P5. Digital data D3, D4 and D5 of each bit included in the information of lower n bit outputted from the inversion controller 5 are inputted to the switches SW3, SW4 and SW5 as a control signal for switching the foregoing connection and the disconnection, and the switches SW3, SW4 and SW5 respectively connect the nodes P3, P4 and P5 to the connection terminals Q3, Q4 and Q5 when the digital data is 1, and respectively connect the nodes P3, P4 and P5 to the connection terminals R3, R4 and R5 when the digital data is 0.

Meanwhile, the connection switching section (switching means) 24 includes a switch SWC. The switch SWC operates to carry out connection and disconnection between the connection terminal PC and a plurality of connection terminals (a connection terminal V1 and a connection terminal V2 in this case), respectively. In the present embodiment, the connection terminal V1 is supplied with the reference voltage $V_H$, and the connection terminal V2 is supplied with the reference voltage $V_L$. Note that, the switch SWC otherwise may connect the input terminal PC to a connection terminal supplied with an intermediate voltage between the reference voltage $V_H$ and the reference voltage $V_L$. The switch SWC carries out the foregoing connection and the disconnection by the control signal CL so as to switch the offset level control voltage.

Next, the following will explain operation of the D/A converter 10 having the foregoing configuration.

Here, the following will again explain the operation of the first stage D/A converter 1 with reference to FIG. 16. As shown in FIG. 16, the first stage D/A converter 1 realized as the resistor string type D/A converter includes a resistor string 61, a reference voltage switch 62, a reference voltage $V_H$ buffer amp 63, and a reference voltage $V_L$ buffer amp 64. When the upper m bits of the digital input data are "111", for example, the switches SH0 and SL0 (SH1) are turned on so as to output the respective voltages in both ends of the resistor r0 as the reference voltage $V_H$ and the reference voltage $V_L$. Further, when the upper m bits are "110", the switches SH1 (SL0) and SL1 (SH2) are turned on so as to output the respective voltages in both ends of the resistor r1 as the reference voltage $V_H$ and the reference voltage $V_L$. For the rest, the reference voltage $V_H$ and the reference voltage $V_L$ corresponding to each resistor are outputted by operating those switches in accordance with the digital inputs down to the upper m bits of "000".

Figure 3:
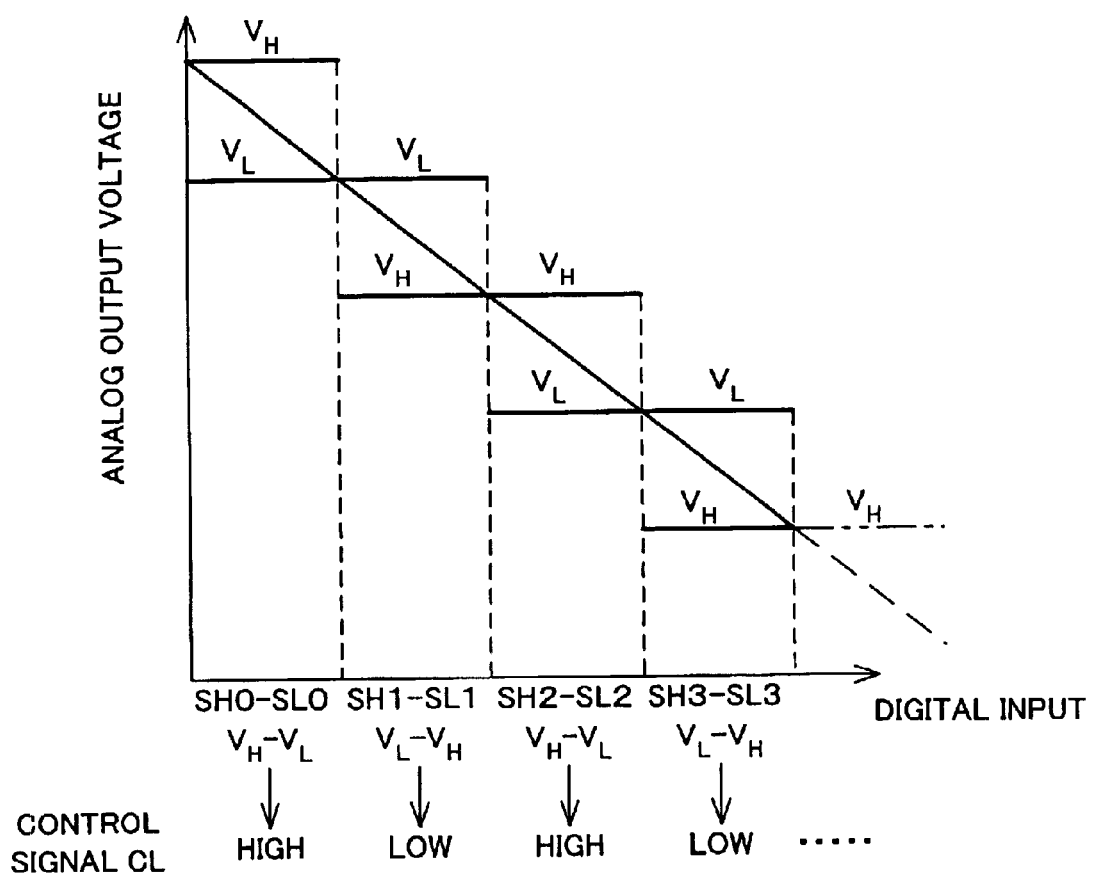
FIG. 3 is a drawing illustrating correlation between input and output of a first stage D/A converter included in the D/A converter of FIG. 1, and also showing a range of analog output voltage with respect to upper bit of digital input.
Figure 11:
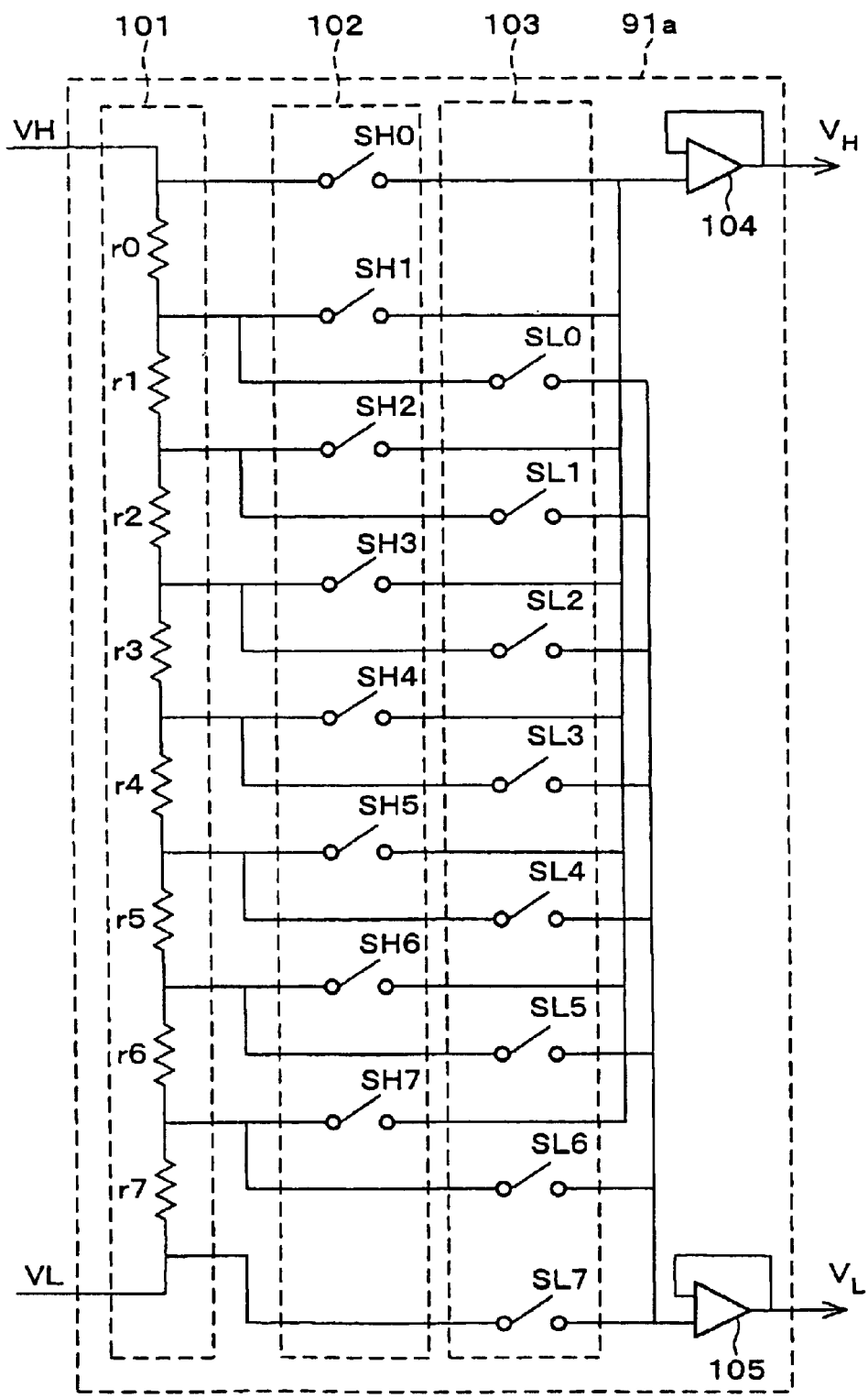
FIG. 11 is a circuit diagram showing an arrangement of a first stage D/A converter included in the two-stage D/A converter of FIG. 10.
Figure 12:
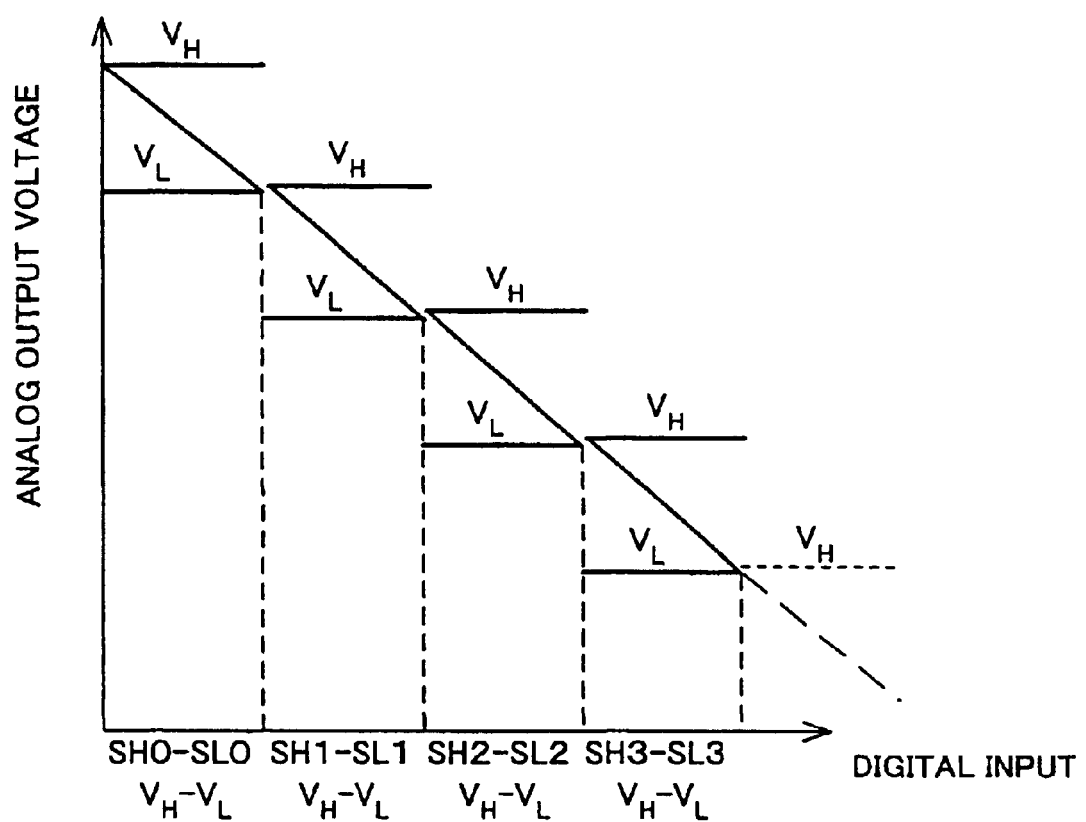
FIG. 12 is a drawing illustrating correlation between input and output of the first stage D/A converter of FIG. 11, and also showing a range of analog output voltage with respect to upper bit of digital input.
Figure 13:
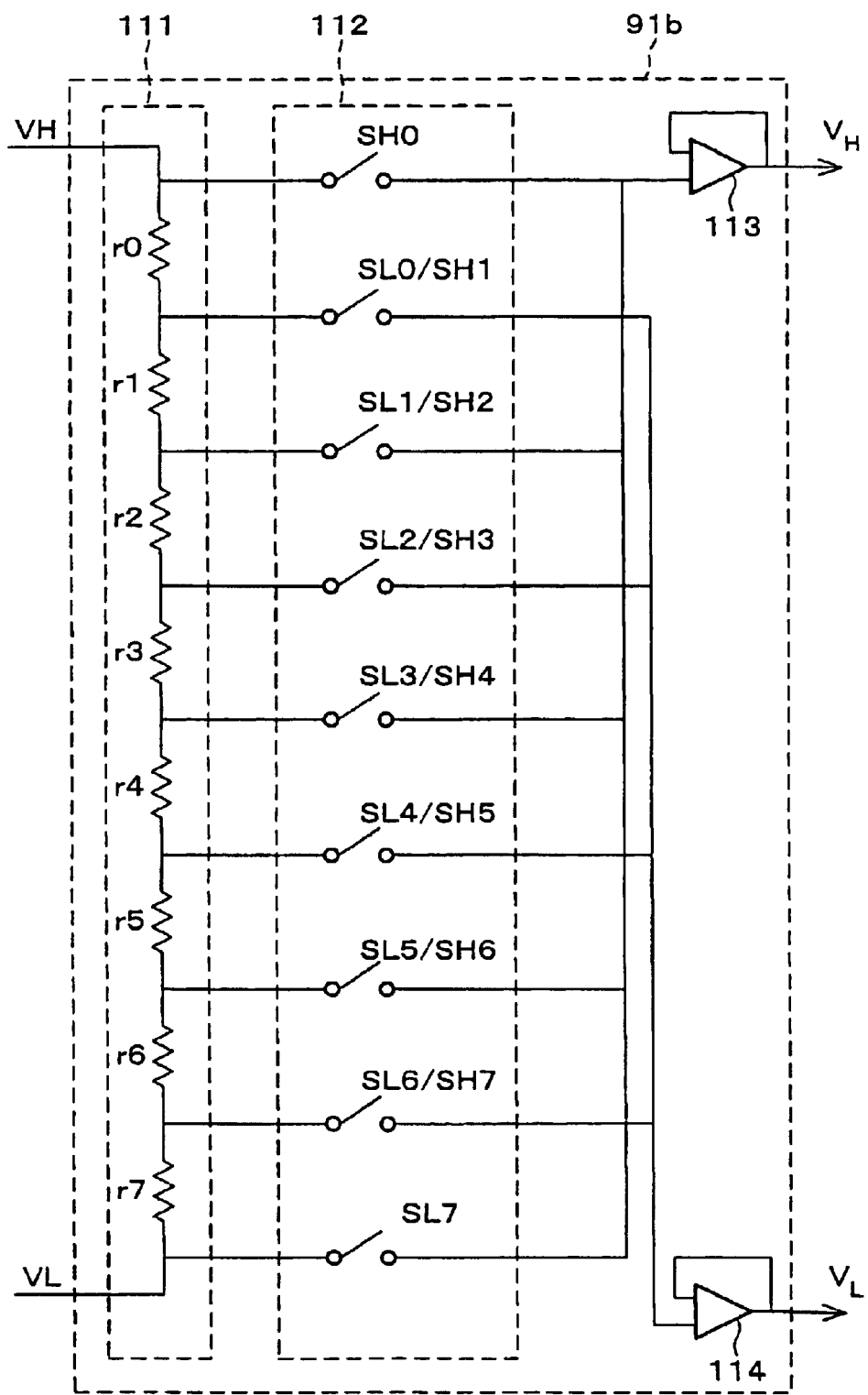
FIG. 13 is a circuit diagram showing an arrangement of another first stage D/A converter included in the conventional two-stage D/A converter.

Here, this resistor string type D/A converter differs from the resistor string type D/A converter 91a of FIG. 11 in the following point. In the resistor string type D/A converter 91a, the reference voltage $V_H$ is always outputted with higher voltage level than the reference voltage $V_L$; in contrast, in the foregoing resistor string type D/A converter, the voltage levels of the reference voltage $V_H$ and the reference voltage $V_L$ alternately become high or low. Namely, in the case of digital input of the upper m bit which turns on even numbered switches SHx, SLx (x is an even number), the voltage level of the reference voltage $V_H$ becomes higher than that of the reference voltage $V_L$ (the control signal CL=HIGH); and in the case of digital input of the upper m bit which turns on odd numbered switches SHy, SLy (y is an odd number), the voltage level of the reference voltage $V_L$ becomes higher than that of the reference voltage $V_H$ (the control signal CL=LOW). With this operation, as shown in FIG. 3, a discontinuity does not occur at a border of the range of analog output voltage when the upper m bit is switched in the first stage D/A converter 1 realized by the resistor string type D/A converter having the arrangement shown in FIG. 16.

The range of analog output voltage in the second stage R-2R ladder resistor type D/A converter 2 with respect to a given upper m bit becomes $V_L$ to ($V_H$–1LSB) as shown in FIG. 4(*a*) when the reference voltage $V_L$ is inputted to the input terminal PC by the control signal CL while the reference voltage $V_H$ is inputted to the connection terminal V1 and the reference voltage $V_L$ is inputted to the connection terminal V2. Further, the range becomes ($V_L$+1LSB) to $V_H$ as shown in FIG. 4(*b*) when the reference voltage $V_H$ is inputted to the input terminal PC by the control signal CL, as shown in FIG. 4(*b*).

Figure 5A:
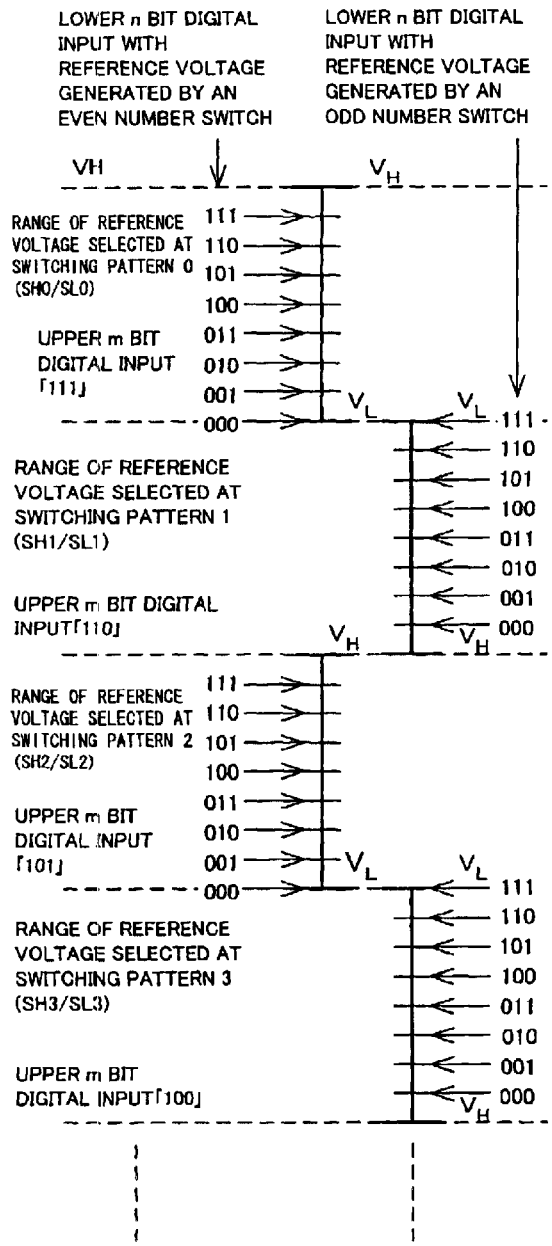
FIG. 5(a) shows a comparative example, and is a drawing illustrating correlation between input and output in a state where a switch SWC included in the second stage R-2R ladder resistor type D/A converter of FIG. 2 is provided by fixing its input terminal PC to a connection V2 terminal (reference voltage $V_L$), and also showing a range of analog output voltage with respect to lower bit of digital input in the respective upper bits.
Figure 5B:
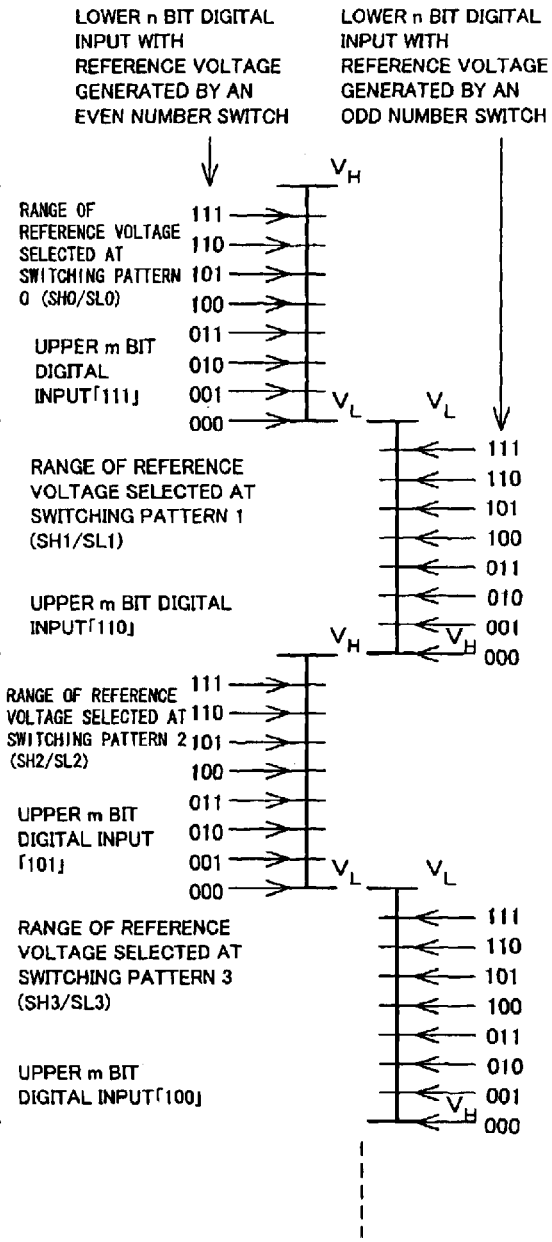
FIG. 5(b) shows the embodiment above, and is a drawing illustrating correlation between input and output of the second stage R-2R ladder resistor type D/A converter of FIG. 2, and also showing a range of analog output voltage with respect to lower bit of digital input in the respective upper bits.

Here, as a comparative example, referring to FIG. 5(*a*), the following will explain the range of analog output voltage in the second stage R-2R ladder resistor type D/A converter 2 with respect to each upper m bit when the switch SWC fixedly connects the input terminal PC to the connection terminal V2 (the reference voltage $V_L$).

When the upper m bits of the digital input are "111", the switches SH0 and SL0 (SH1) are turned on so as to output the respective voltages in both ends of the resistor r0 as the reference voltage $V_H$ and the reference voltage $V_L$. At this stage, the control signal CL indicates that the reference voltage $V_H$ is higher than the reference voltage $V_L$ (for example, HIGH level), and the digital data of lower n bit is inputted to the second stage R-2R ladder resistor type D/A converter 2 without being inversed by the inversion controller 5. In FIG. 5(*a*), "Range of reference voltage selected at switching pattern 0 (SH0/SL0)" shows analog output voltages supplied with each digital data of the lower n bit (data within a range between "111" and "000") in the foregoing case where the inputted upper m bits are "111".

Next, when the upper m bits of the digital input are "110", the switches SH1 (SL0) and SL1 (SH2) shown in FIG. 16 are turned on so as to output the respective voltages in both ends of the resistor r1 as the reference voltage $V_L$ and the reference voltage $V_H$. At this stage, the control signal CL indicates that the reference voltage $V_H$ is lower than the reference voltage $V_L$ (for example, LOW level), and the digital data of lower n bit is inputted to the second stage R-2R ladder resistor type D/A converter 2 by being inversed by the inversion controller 5. In FIG. 5(*a*), "Range of reference voltage selected at switching pattern 1 (SH1/SL1)" shows analog output voltages supplied with each digital data of the lower n bit (data within a range between "111" and "000") in the foregoing case where the inputted upper m bits are "110".

Further, when the upper m bits of the digital input are "101", the switches SH2 (SL1) and SL2 (SH3) are turned on so as to output the respective voltages in both ends of the resistor r2 as the reference voltage $V_H$ and the reference voltage $V_L$. At this stage, the control signal CL indicates that the reference voltage $V_H$ is higher than the reference voltage $V_L$ (for example, HIGH level), and the digital data of lower n bit is inputted to the second stage R-2R ladder resistor type D/A converter 2 without being inversed by the inversion controller 5. In FIG. 5(*a*), "Range of reference voltage selected at switching pattern 2 (SH2/SL2)" shows analog output voltages supplied with each digital data of the lower n bit (data within a range between "111" and "000") in the foregoing case where the inputted upper m bits are "101".

Here, the range of analog output voltage of FIG. 5(*a*) revealed that the analog voltage with respect to upper m bits of "111" and lower n bits of "000" and the analog voltage with respect to upper m bits of "110" and lower n bit of "111" has the same value (the difference is 0LSB), and also, the analog voltage with respect to upper m bits of "110" and lower n bits of "000" and the analog voltage with respect to upper m bits of "101" and lower n bits of "111" have the difference of 2LSB. In other words, in the arrangement in which the switch SWC fixedly connects the input terminal PC to the connection terminal V2 (the reference voltage VL), as with the comparative example of FIG. 5(*a*), the range of analog output voltage with respect to the digital input data Din shows nonlinear variation.

Further, the figure also revealed that, by moving the analog output voltage value of the second stage R-2R ladder resistor type D/A converter 2 downward by 1 LSB when having an odd numbered switching pattern with respect to upper m bit (when the upper m bits are "110", for example), all cases show equal variation of 1 LSB (i.e., differential nonlinearity: DNL=0) regardless of the value of upper m bit, as shown in FIG. 5(*b*).

In the D/A converter circuit 10 of the present invention, when the reference voltage $V_H$ is higher than the reference voltage $V_L$ (at an even numbered switching pattern with respect to upper m bit, i.e., the control signal=HIGH), the switch SWC of the connection switching section 24 connects the input terminal PC of the offset level control resistor 22 to the connection terminal V2 (the reference voltage $V_L$). Further, when the reference voltage $V_H$ is lower than the reference voltage $V_L$ (at an odd numbered switching pattern with respect to upper m bit, i.e., the control signal=LOW), the switch SWC of the connection switching section 24 connects the input terminal PC of the offset level control resistor 22 to the connection terminal V1 (the reference voltage $V_H$).

Accordingly, when the upper m bits are "111", "101", "011" or "001" (the control signal CL=HIGH), the reference voltage $V_L$ is inputted to the input terminal PC of the offset level control resistor 22, and when the upper m bits are "110", "100", "010" or "000" (the control signal CL=LOW), the reference voltage $V_H$ is inputted to the input terminal PC of the offset level control resistor 22.

As described, by thus operating the switch SWC of the connection switching section 24 according to the value of digital data of upper m bit, all cases show the variation of 1 LSB as shown in FIG. 5(*b*) (differential nonlinearity: DNL= 0) at switching of the bit regardless of the value of upper m bit, thereby compensating the discontinuity.

Further, the reference voltages $V_H$ and $V_L$ are inputted to the group of switches 23 and the connection switching section 24 without passing through such as an exchanger, i.e., without being varied. As a result, uniformity is ensured until those voltages are inputted to group of switches 23 and the connection switching section 24. Further, as described later, since the switches SW3 through SW5 of the group of switches 23 are capable of adjustment of resistance value, the uniformity can further be maintained even after the group of switches 23

Further, the switch SWC of the connection switching section 24 only varies input voltage to the offset level control resistor 22. Here, the offset level control resistor 22 is not used for D/A conversion itself but offset level control, and therefore influence to the analog output voltage Aout will be not more than 1LSB as long as the input voltage to the offset level control resistor 22 has voltage value between the reference voltage $V_H$ and the reference voltage $V_L$. Thus, ON-resistance of the switch SWC does not cause degradation of D/A conversion accuracy.

As described, the D/A converter circuit 10 of the present invention is capable of carrying out D/A conversion by using the second stage R-2R ladder resistor type D/A converter 2 without using such as an exchanger even with the first stage D/A converter 1 in which the voltage levels of the reference voltage $V_H$ and the reference voltage $V_L$ become alternately high or low according to the upper m bit. Consequently, higher D/A conversion accuracy can be obtained since the exchanger including a plurality of switches is not required.

As a result, it is possible to provide a D/A converter circuit carrying out (m+n) bits D/A conversion by generating two kinds of reference voltages, which are used in a second n bit R-2R ladder resistor type D/A converter, by a m bit D/A converter, and also capable of easily ensuring uniformity and continuity, and further capable of obtaining high D/A conversion accuracy.

Further, in the D/A converter circuit 10, the second stage R-2R ladder resistor type D/A converter 2 switches the input voltage to the input terminal PC of the offset level control resistor 22 by the connection switching section 24. Thus, it is possible to ensure uniformity of output analog voltage value in the case where voltage levels of the reference voltages $V_H$ and $V_L$ are switched by switching of the upper m bit of digital data of (m+n) bits.

Further, in the D/A converter circuit 10, the connection switching section 24 switches the input voltage to the input terminal PC of the offset level control resistor 22 according to the control signal CE generated by the controller 4, thus automatically switching the input voltage to the input terminal PC.

Further, in the D/A converter circuit 10, the reference voltage $V_H$ and the reference voltage $V_L$ are used as the voltage switched by connection switching section 24 and therefore the input voltage to the input terminal PC may be switched to the reference voltage $V_H$ or the reference voltage $V_L$. Thus, even in the case where voltage levels of the reference voltages $V_H$ and $V_L$ are switched by switching of the upper m bit, it is possible to suppress the differential nonlinearity as with the case where voltage levels are switched by switching of the lower n bit.

Further, in the foregoing example, the resistor string type D/A converter circuit having the arrangement shown in FIG. 16 is provided in the D/A converter circuit 10 as the first stage D/A converter 1; however, the D/A converter as the first stage D/A converter 1 may have an arbitrary arrangement to be used with the second stage R-2R ladder resistor type D/A converter 2 as long as it is capable of outputting the reference voltages $V_H$ and $V_L$. Further, one of the voltage levels of reference voltage $V_H$ and the reference voltage $V_L$ may be higher at all times.

Note that, FIG. 2 shows an R-2R resistor ladder type D/A converter, used as the second D/A converter after the first stage D/A converter 1, having a simplest arrangement but additionally includes an offset level control voltage switching section 24. The R-2R resistor ladder type D/A converter used as the second D/A converter may also adopt an arrangement realizing the ratio of 1:2 between the resistance value R and the resistance value 2R by including the ON-resistance of the switches as well so as to ensure the ratio of 1:2, for example, the D/A converter may have an arrangement of providing a switch always turned on on the side of resistance value R, or an arrangement adding the connection switching section 24 to an R-2R resistor ladder type D/A converter arranged so that the resistor having the resistance value 2R is provided by previously subtracting ON-resistance of the group of switches 23 so as to compensate the ratio of 1:2.

Figure 6A:
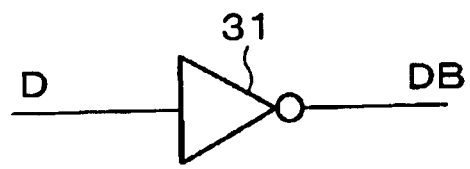
FIG. 6(a) is a circuit diagram showing a circuit used for the case of using a CMOS switch for constituting the switches of the second stage R-2R ladder resistor type D/A converter of FIG. 2, and also showing an inverter for generating an inversion signal supplied to the CMOS switch.
Figure 6B:
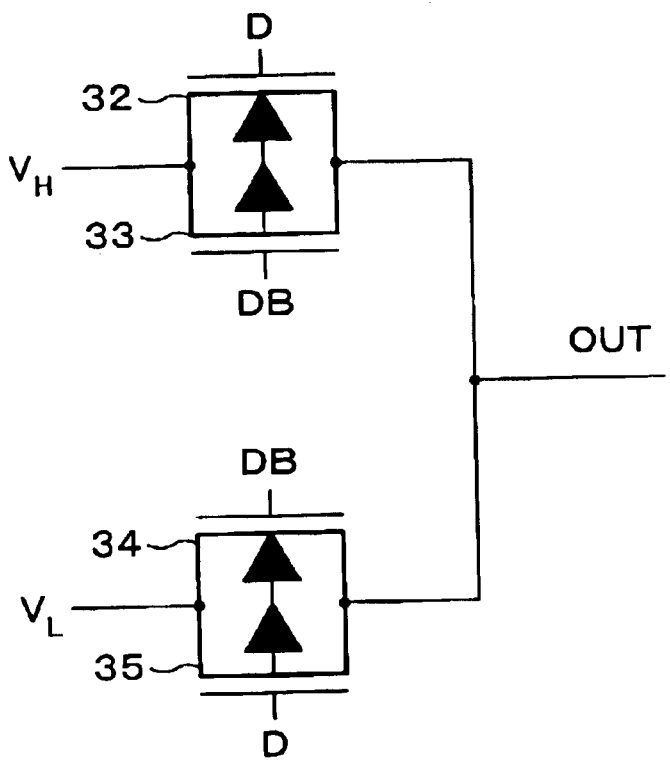
FIG. 6(b) is a circuit diagram showing a circuit used for the case of using a CMOS switch for constituting the switches of the second stage R-2R ladder resistor type D/A converter of FIG. 2, and also showing an arrangement example of the CMOS switch.

Further, in the second stage R-2R resistor ladder type D/A converter 2, it is preferable that the switches SW3 through SW 5 constituting the group of switches 23 and the switch SWC of the connection switching section 24 are composed by a CMOS transistor structure as shown in FIG. 6(b). With this arrangement, the switching function of the input voltage to the input terminal PC of the offset level control resistor 22 can easily be created through the CMOS process. When a signal D is supplied for controlling operation of those switches, a inversion signal DB is created from the signal D by the inverter 31 as shown in FIG. 6(a), and the signal D is inputted to the gate of an N-type MOS transistor 32 and the gate of an P-type MOS transistor 35 as shown in FIG. 6(b), and the inversion signal DB is inputted to the gate of an P-type MOS transistor 33 and the gate of an N-type MOS transistor 34. In the switches SW3 through SW5, the signal D corresponds to the digital data D3 through D5 inputted from the inversion controller 5, and in the switch SWC, the signal D corresponds to the inversion signal of the control signal CL. Further, a terminal OUT corresponds to the input terminals P3 through P5 in the switches SW3 through SW5, and corresponds to the input terminal PC in the switch SWC.

Further, in the example shown in FIGS. 6(a) and 6(b), the N-type MOS transistor 32, the P-type MOS transistor 33, the N-type MOS transistor 34 and the P-type MOS transistor 35 are analog switches, which operate as a respective pair of the transistors 32 and 33; and the transistors 34 and 35. These switches operate in a complemented manner of the P-type MOS transistor and the N-type MOS transistor. When the reference voltages $V_H$ and $V_L$ have voltage level close to the power source voltage, the N-type MOS transistors 32 and 34 are turned on, and when the reference voltages $V_H$ and $V_L$ have voltage level close to ground potential, the P-type MOS transistors 33 and 35 are turned on. Thus, conductivities of these switches are ensured with respect to any voltages of the connection terminals Q3 through Q5 or QC, or the voltages of the connection terminals R3 through R5 or the RC as long as the voltages are in a range between the power source voltage and ground level. As a result, a wider dynamic range can be ensured in the D/A converter circuit 10.

Figure 7A:
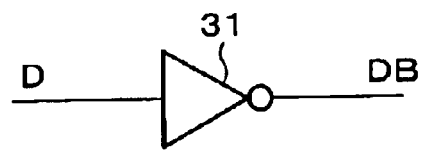
FIG. 7(a) is a circuit diagram showing a circuit used for the case of using CMOS switch for constituting the switches of the second stage R-2R ladder resistor type D/A converter of FIG. 2 and further providing dummy switches, and also showing an inverter for generating an inversion signal supplied to the CMOS switch and the dummy switches.
Figure 7B:
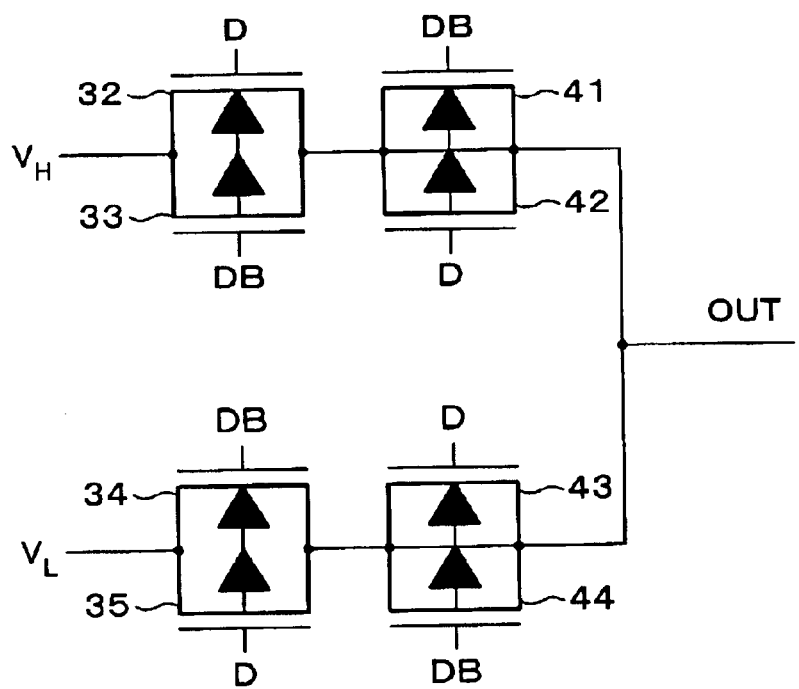
FIG. 7(b) is a circuit diagram showing a circuit used for the case of using a CMOS switch for constituting the switches of the second stage R-2R ladder resistor type D/A converter of FIG. 2 and further providing dummy switches, and also showing an arrangement example of the CMOS switch and the dummy switches.
Figure 8:
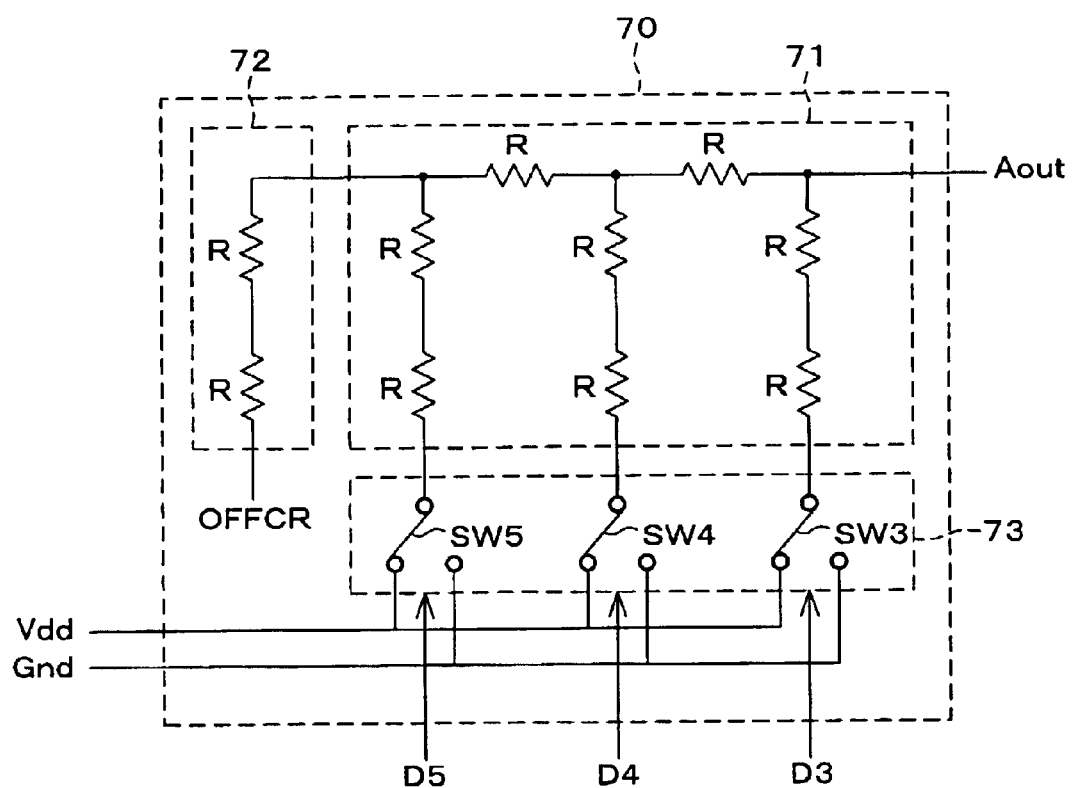
FIG. 8 is a circuit diagram showing an arrangement of a conventional R-2R ladder resistor type D/A converter.
Figure 9A:
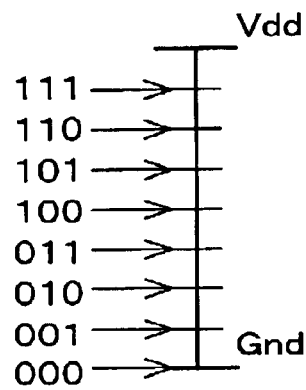
FIG. 9(a) is a drawing illustrating an example of correlation between input and output of the R-2R ladder resistor type D/A converter of FIG. 8, and also showing a range of analog output voltage with respect to digital input data when an offset terminal OFFCR is adjusted to Gnd level.
Figure 9B:
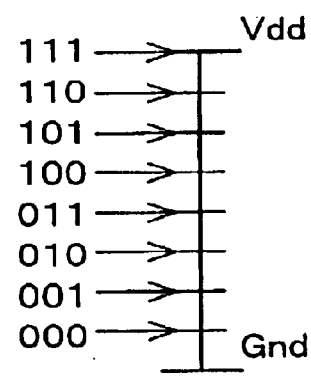
FIG. 9(b) is a drawing illustrating an example of correlation between input and output of the R-2R ladder resistor type D/A converter of FIG. 8, and also showing a range of analog output voltage with respect to digital input data when an offset terminal OFFCR is supplied with a power source voltage Vdd.
Figure 9C:
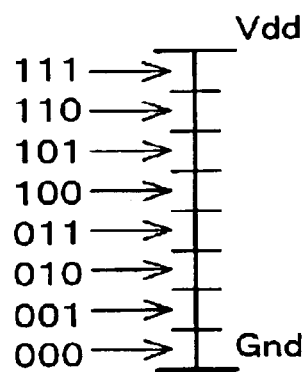
FIG. 9(c) is a drawing illustrating an example of correlation between input and output of the R-2R ladder resistor type D/A converter of FIG. 8, and also showing a range of analog output voltage with respect to digital input data when an offset terminal OFFCR is supplied with an intermediate voltage between Gnd level and a power source voltage level Vdd.
Figure 10:
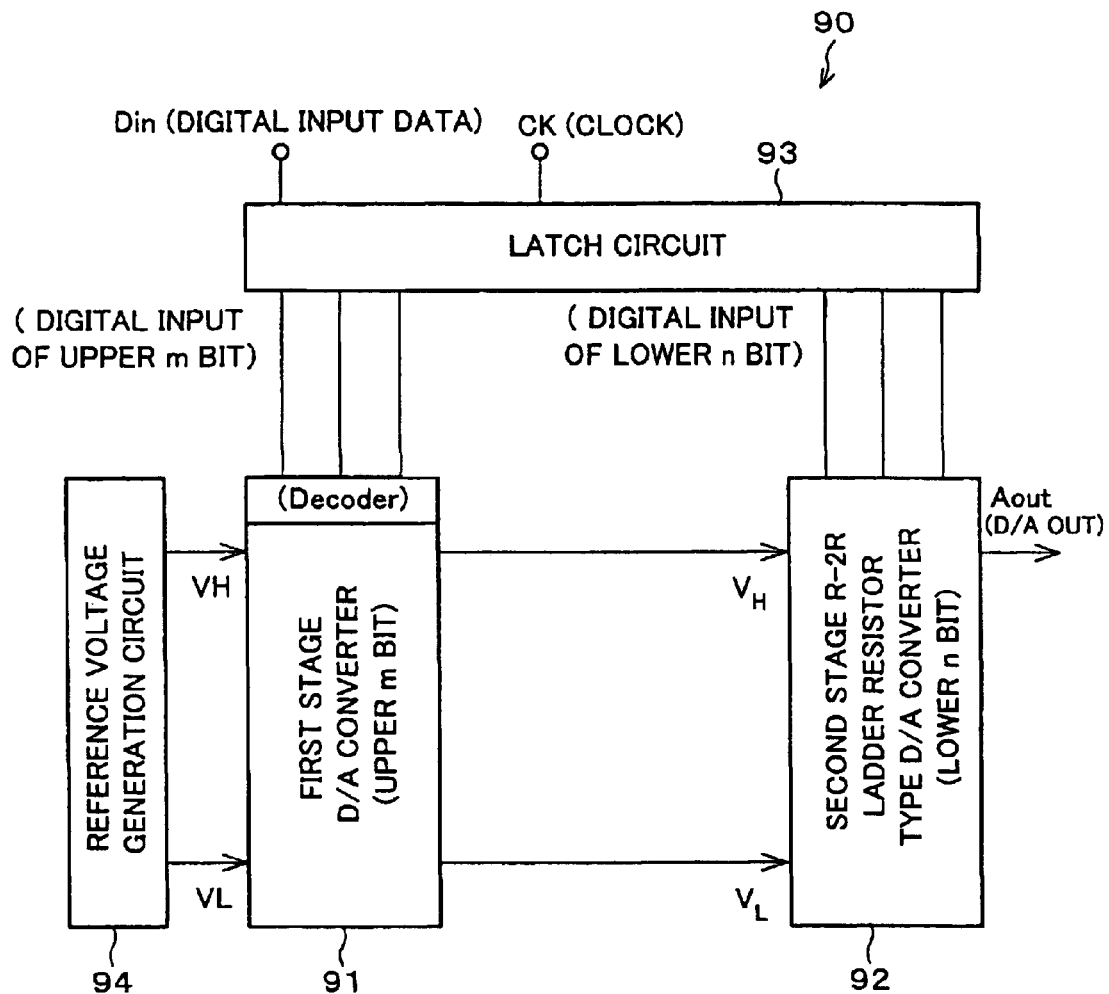
FIG. 10 is a block diagram showing an arrangement of a conventional two-stage D/A converter.

Further, as shown in FIG. 7(b), an N-type MOS transistor 41 and a P-type MOS transistor 42; and an N-type MOS transistor 43 and a P-type MOS transistor 44 may be provided respectively as dummy switches. FIG. 7(a) shows a case of generating the inversion signal DB from the signal D by the inverter 31, as with FIG. 6(a). The N-type MOS transistor 41 and the P-type MOS transistor 42 are connected in parallel, and provided between the N-type MOS transistor 32 and the P-type MOS transistor 33, and the terminal OUT, to be in parallel with a signal line where the N-type MOS transistor 32 and the P-type MOS transistor 33 are provided. The N-type MOS transistor 41 is supplied with a gate signal in opposite phase to that of the N-type MOS transistor 32 having the same polarity, and the P-type MOS transistor 42 is supplied with a gate signal in opposite phase to that of the P-type MOS transistor 33 having the same polarity. The relation between (a) the combination of the N-type MOS transistor 43 and the P-type MOS transistor 44, and (b) the combination of the N-type MOS transistor 34 and the P-type MOS transistor 35 is the same as the relation between (c) the combination of the N-type MOS transistor 41 and the P-type MOS transistor 42, and (d) the combination of the N-type MOS transistor 32 and the P-type MOS transistor 33.

In the foregoing manner, the dummy switch made up of the N-type MOS transistor 41 and the P-type MOS transistor 42 is serially connected to the analog switch made up of the N-type MOS transistor 32 and the P-type MOS transistor 33, and the dummy switch made up of the N-type MOS transistor 43 and the P-type MOS transistor 44 is serially connected to the analog switch made up of the N-type MOS transistor 34 and the P-type MOS transistor 35. Therefore, it is possible to cancel noise (clock noise) due to a phenomenon (clock field through) such that charge between source and bulk, and between drain and bulk, accumulated when the analog switch is turned on is distributed with turning of the analog switch from ON-state to OFF-state.

Further, the D/A converter circuit 10 thus explained may be formed in a single integrated circuit. In this arrangement, by having the reference voltage generation circuit 6 for supplying the reference voltages VH and VL in the first stage D/A converter 1, the reference voltages VH and VL may be generated in the same integrated circuit. Thus, it is not necessary to externally supply the reference voltage.

Further, the foregoing D/A converter 10 can be used as a control voltage generation circuit at AFE (Analog Front End) in a portable terminal device of W-CDMA (Wideband-Code Division Multiple Access) specification. On this account, high D/A conversion accuracy can be obtained which ensures uniformity and continuity of the output analog voltage value at a portion carrying out D/A conversion in the control voltage generation circuit.

Further, the foregoing D/A converter circuit 10 can also be used as a volume control circuit of an audio device. On this account, high D/A conversion accuracy can be obtained which ensures uniformity and continuity of the output analog voltage value at a portion carrying out D/A conversion in the volume control circuit.

As described, a D/A converter circuit of the present invention includes: a first D/A converter (first stage D/A converter 1) for generating a first reference voltage $V_H$ and a second reference voltage $V_L$ different to each other in voltage level according to upper m bit of digital input data of (m+n) bits; a second D/A converter (second stage R-2R ladder resistor type D/A converter 2) of R-2R ladder resistor type for converting the digital input data to an analog voltage value Aout by using information of lower n bit of the digital input data and the first and second reference voltages so that the analog voltage value is within a range whose upper limit is a higher voltage level of the first reference voltage and the second reference voltage, and whose lower limit is a lower voltage level of the first reference voltage and the second reference voltage, the first reference voltage being supplied to respective input terminals (P3 through P5) on digital data input side of a ladder resistor-net (resistor-net 21 and offset level control resistor 22) in the second D/A converter when each bit of digital data of the lower n bit inputted to the second D/A converter has a first value, and the second reference voltage being inputted to the respective input terminals on the digital data (D3 through D5) input side of the ladder resistor-net in the second D/A converter when the bit of the digital data of the lower n bit supplied to the second D/A converter has a second value; controlling means (controller 4) for generating a control signal (CL) according to which of voltage levels of the first reference voltage and the second reference voltage is higher; and inverting means (inversion controller 5) for inputting the digital data of the lower n bit as such to the second D/A converter when the control signal shows that the first reference voltage is higher in voltage level than the second reference voltage, and inputting the digital data of the lower n bit to the second D/A converter by exchanging the first value and the second value of the digital data of the lower n bit when the control signal shows that the first reference voltage is lower in voltage level than the second reference voltage.

With the foregoing arrangement, the provided first D/A converter generates the first and second reference voltages of different voltage levels that are according to the upper m bit of the digital input data of (m+n) bits. The first D/A converter inputs the first and second voltages to the second D/A converter of an R-2R ladder resistor type. The controlling means generates a control signal according to which of voltage levels of the first reference voltage and the second reference voltage is higher. Further, the inverting means inputs the digital data of the lower n bit as such to the second D/A converter when the control signal shows that the first reference voltage is higher in voltage level than the second reference voltage, and inputs the digital data of the lower n bit to the second D/A converter by exchanging the first value and the second value of the digital data of the lower n bit when the control signal shows that the first reference voltage is lower in voltage level than the second reference voltage.

With the foregoing operation by the inverting means, when the digital data is supplied to respective input terminals on digital data input side of a ladder resistor-net in the second D/A converter by the inverting means, the reference voltage of higher voltage level is supplied to respective input terminals on digital data input side of a ladder resistor-net in the second D/A converter when each bit of digital data of the lower n bit inputted to the second D/A converter has a first value, and the second reference voltage is inputted to the respective input terminals on the digital data input side of the ladder resistor-net in the second D/A converter when the bit of the digital data of the lower n bit supplied to the second D/A converter has a second value regardless of which of voltage levels of the first and second reference voltages is higher. Then, the second D/A converter uses the information of lower n bit, i.e., the digital data inputted from the inverting means and the first and second reference voltages so as to convert the digital data into an analog voltage value so that the analog voltage value is within a range whose upper limit is a higher voltage level of the first reference voltage and the second reference voltage, and whose lower limit is a lower voltage level of the first reference voltage and the second reference voltage.

On this account, D/A conversion can be carried out by using the second D/A converter without using such as an exchanger even with the first D/A converter in which the voltage levels of the first reference voltage and the second reference voltage become alternately high or low according to the upper m bit. Consequently, higher D/A conversion accuracy can be obtained since the exchanger including a plurality of switches is not required.

As a result, it is possible to provide a D/A converter circuit carrying out (m+n) bits D/A conversion by generating two kinds of reference voltages, which are used in a second n bit R-2R ladder resistor type D/A converter, by a m bit D/A converter, and also capable of easily ensuring uniformity and continuity of the output analog voltage value, and further capable of obtaining high D/A conversion accuracy.

Further, in addition to the foregoing configuration, the second D/A converter may include switching means (connection switching section 24) for switching a voltage inputted to an input terminal (PC) of an offset level control resistor (22).

With the foregoing arrangement, the second D/A converter switches the input voltage to the input terminal of the offset level control resistor by the switching means. Thus, it is possible to ensure uniformity of the output analog voltage value in the case where voltage levels of the first and second reference voltages are switched by switching of the upper m bit of digital data of (m+n) bits.

Further, in addition to the foregoing configuration, the switching means may switch the voltage inputted to the input terminal of the offset level control resistor according to the control signal.

With the foregoing arrangement, the switching means switches the input voltage to the input terminal of the offset level control resistor according to the control signal generated by the controlling means, thus automatically switching the input voltage to the input terminal.

Further, in addition to the foregoing configuration, the voltages switched by the switching means may include the first and second reference voltages.

With the foregoing arrangement, the input voltages to the input terminal may be switched to the first reference voltage or the second reference voltage, by the switching means. Thus, even in the case where voltage levels of the first and second reference voltages are switched by switching of the upper m bit, it is possible to suppress the differential nonlinearity as with the case where voltage levels are switched by switching of the lower n bit.

Further, in addition to the foregoing configuration, the switching means may include switches (32, 33 and 34, 35) of a CMOS transistor structure corresponding to a plurality of connection terminals (QC and RC) different in voltage level so as to switch the voltages inputted to the input terminal (PC) of the offset level control resistor by carrying out connection and disconnection between the input terminal of the offset level control resistor and the connection terminals.

With the foregoing arrangement, the voltages inputted to the input terminal of the offset level control resistor is switched by carrying out connection and disconnection by the switches of a CMOS transistor structure so as to connect one of the plural connection terminals of different voltage levels to the input terminal of the offset level control resistor. Thus, the switching function of the input voltage to the input terminal of the offset level control resistor can easily be created through CMOS process.

Further, in addition to the foregoing configuration, the switches (32, 33 and 34, 35) are operated in a complemented manner of P-type (33 and 35) and N-type (32 and 34).

With the foregoing arrangement, since the switches are operated in a complemented manner of P-type and N-type, the switches are capable of accepting all voltage ranges: from power source voltage of respective connection terminals to GND level. Thus, a wider dynamic range can be ensured in the D/A converter circuit.

Further, in addition to the foregoing configuration, dummy switches made up of an N-type MOS transistor (42 and 44) and a P-type MOS transistor (41 and 43) having respective polarities may be provided. The N-type MOS transistor and the P-type MOS transistor are provided parallel with each other, and the dummy switches (41, 42 and 43, 44) is provided parallel with a signal line having the switches and between the switches and the input terminal of the offset level control resistor, and the P-type MOS transistor and the N-type MOS transistor each receives a gate signal that is completely out of phase with a gate signal that is supplied to the MOS transistor of the switches having the same polarity.

With the foregoing arrangement, by having the dummy switches, it is possible to cancel clock noise that is incurred when the switches are turned from ON-state to OFF-state.

Further, the D/A converter circuit of the present invention may be formed in a single integrated circuit, and the first D/A converter may include base reference voltage generating means (reference voltage generation circuit 6) for generating base reference voltages (VH, VL) so as to generate the first and second reference voltages.

With the foregoing arrangement, since the first D/A converter creates the base reference voltage to generate the first and second reference voltages by the base reference voltage generating means provided in the same integrated circuit, it is not necessary to externally supply the reference voltage.

Further, in addition to the foregoing configuration, the first D/A converter may output the first reference voltage and the second reference voltage so that voltage levels of the first and second reference voltages alternately become high or low according to the upper m bit; otherwise, the first D/A converter may output the first reference voltage and the second reference voltage according to the upper m bit so that the first reference voltage or the second reference voltage outputted when the upper m bit takes a first value, and the first reference voltage or the second reference voltage outputted when the upper m bit takes a second value that is outputted after the first value have a same voltage level.

More specifically, the first D/A converter circuit may include a first output circuit (reference voltage $V_H$ buffer amp 63) for outputting the first reference voltage; a second output circuit (reference voltage $V_L$ buffer amp 64) for outputting the second reference voltage; an even numbered switch (Switches SL0, SL2, SL4 and SL6) provided between an even numbered node, as counted from higher to lower voltage levels, of a plurality of nodes kept in different voltage levels, and an input terminal of a predetermined one (For example, reference voltage $V_L$ buffer amp 64) of the first and second output circuits; and an odd numbered switch (Switches SH0, SL1, SL3, SL5 and SL7) provided between an odd numbered node, as counted from higher to lower voltage levels, of the plurality of nodes kept in different voltage levels, and an input terminal of the other (For example, reference voltage $V_H$ buffer amp 63) of the first and second output circuits. Otherwise, the first D/A converter circuit may include a first buffer amp (reference voltage $V_H$ buffer amp 63) for outputting the first reference voltage; a second buffer amp (reference voltage $V_L$ buffer amp 64) for outputting the second reference voltage; a series circuit (resistor string 61) made up of a plurality of resistors (r0 through r7) connected to one another in series; a plurality of nodes, provided as respective ends of the series circuit and as respective junctions of the resistors; an even numbered switch (Switches SL0, SL2, SL4 and SL6) provided between an even numbered node, as counted from one end (For example, the side of base reference voltage VH) of the series circuit, of the plurality of nodes and an input terminal of a predetermined one (For example, reference voltage $V_L$ buffer amp 64) of the first and second buffer amps, and an odd numbered switch (Switches SH0, SL1, SL3, SL5 and SL7) provided between an odd numbered node, as counted from the end of the series circuit, of the plurality of nodes and an input terminal of the other (For example, reference voltage $V_H$ buffer amp 63) of the first and second buffer amps.

With the foregoing arrangement, the first reference voltage or the second reference voltage outputted when the upper m bit takes a first value has a same voltage level as that of the first reference voltage or the second reference voltage outputted when the upper m bit takes a second value that is outputted after the first value. Thus, it is possible to suppress a decrease of uniformity of the output analog voltage value due to a difference of voltage levels between a higher voltage level of the first reference voltage and the second reference voltage that is outputted when the upper m bit takes a certain value, and a lower voltage level of the first reference voltage and the second reference voltage that is outputted when the upper m bit takes a value greater than the certain value by one.

Here, the voltage levels of the first reference voltage and the second reference voltage alternately become high or low with the switching of the upper m bit. However, even with this change of voltage levels, and in the absence of an exchanger between the first D/A converter and the second D/A converter, the described operation of the inverting means allows the D/A converter circuit to output an analog voltage value with no difficulties. On this account, it is possible to provide a D/A converter circuit capable of easily ensuring uniformity and continuity of the output analog voltage value, and further capable of obtaining high D/A conversion accuracy.

Further, as explained, a portable terminal device of the present invention includes one of the described D/A converter circuits.

With the foregoing arrangement, uniformity and continuity of the output analog voltage value can be ensured and also high D/A conversion accuracy can be obtained at a portion carrying out D/A conversion, such as a control voltage generation circuit at an Analog Front End in a portable terminal device.

Further, as explained, an audio device of the present invention includes one of the described D/A converter circuits.

With the foregoing arrangement, uniformity and continuity of the output analog voltage value can be ensured and also high D/A conversion accuracy can be obtained at a portion carrying out D/A conversion, such as a volume control circuit of the audio device.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A D/A converter circuit, comprising:

a first D/A converter for generating a first reference voltage and a second reference voltage different to each other in voltage level according to upper m bit of digital input data of (m+n) bits;

a second D/A converter of R-2R ladder resistor type for converting the digital input data to an analog voltage value by using information of lower n bit of the digital input data and the first and second reference voltages so that the analog voltage value is within a range whose upper limit is a higher voltage level of the first reference voltage an the second reference voltage, and whose lower limit is a lower voltage level of the first reference voltage an the second reference voltage, the first reference voltage being supplied to respective input terminals on digital data input side of a ladder resistor-net in the second D/A converter when each bit of digital data of the lower bit inputted to the second D/A converter has a first value, and the second reference voltage being inputted to the respective input terminals on the digital data input side of the ladder resistor-net in the second D/A converter when each bit of the digital data of the lower n bit supplied to the second D/A converter has a second value, controlling means for generating a control signal according to which of voltage levels of the first reference voltage and the second reference voltage is higher;

inverting means for inputting the digital data of the lower n bit as such to the second D/A converter when the control signal shows that the first reference voltage is higher in voltage level than the second reference voltage, and inputting the digital data of the lower n bit to the second D/A converter by exchanging the first value and the second value of the digital data of the lower n bit when the control signal shows that the first reference voltage is lower in voltage level than the second reference voltage, wherein the second D/A converter includes switching means for witching a voltage inputted to an input terminal of an offset level control resistor, wherein the switching means includes switches of a CMOS transistor structure corresponding to a plurality of connection terminals different in voltage level so as to switch the voltage inputted to the input terminal of the offset level control resistor by carrying out connection and disconnection between the input terminal of the offset level control resistor and the connection terminals, wherein the switches are operated in a complemented manner of P-type and N-type; and dummy switches made up of an N-type MOS transistor and a P-type MOS transistor having respective polarities that are provided parallel with each other, the dummy switches being provided parallel with a signal line having the switches and between the switches and the input terminal of the offset level control resistor, the P-type MOS transistor and the N-type MOS transistor each receiving a gate signal that is completely out of phase with a gate signal that is supplied to the MOS transistor of the switches having the same polarity.

2. The D/A converter circuit as set forth in claim 1, wherein:

the switching means switches the voltage inputted to the input terminal of the offset level control resistor according to the control signal.

3. The D/A converter circuit as set forth in claim 1, wherein:

the switching means switches a voltage inputted to the input terminal of the offset level control resistor by selecting from a plurality of voltages including the first and second reference voltages.

4. The D/A converter circuit as set forth in claim 1, wherein:

the circuit is formed in a single integrated circuit, and the first D/A converter includes base reference voltage generating means for generating a base reference voltage so as to generate the first and second reference voltages.

5. The D/A converter circuit as set forth in claim 1, wherein:

the first D/A converter outputs the first reference voltage and the second reference voltage so that voltage levels of the first and second reference voltages alternately become high or low according to the upper m bit.

6. Th D/A converter circuit as set forth in claim 1, wherein:

the first D/A converter outputs the first reference voltage and the second reference voltage according to the upper m bit so that the first reference voltage or the second reference voltage outputted when the upper m bit takes a first value has a same voltage level as that of the first reference voltage or the second reference voltage outputted when the upper m bit takes a second value that is outputted after the first value.

7. The D/A converter circuit as set forth in claim 1, wherein:
the first D/A converter circuit includes:
a first output circuit for outputting the first reference voltage;
a second output circuit for outputting the second reference voltage;
an even numbered switch provided between an even numbered node, as counted from higher to lower voltage levels, of a plurality of nodes kept in different voltage levels, and an input terminal of a predetermined one of the first and second output circuits; and
an odd numbered switch provided between an odd numbered node, as counted from higher to lower voltage levels, of the plurality of nodes kept in different voltage levels, and an input terminal of the other of the first and second output circuits.

8. The D/A converter circuit as set forth in claim 1, wherein:
the first D/A converter circuit includes:
a first buffer amp for outputting the first reference voltage;
a second buffer amp for outputting the second reference voltage;
a series circuit made up of a plurality of resistors connected one another in series;
a plurality of nodes, provided as respective ends of the series circuit and as respective junctions of the resistors;
an even numbered switch provided between an even numbered node, as counted from one end of the series circuit, of the plurality of nodes and an input terminal of a predetermined one of the first and second buffer amps; and
an odd numbered switch provided between an odd numbered node, as counted from the end of the series circuit, of the plurality of nodes and an input terminal of the other of the first and second buffer amps.

9. A portable terminal device, comprising:
a D/A converter circuit,
the D/A converter circuit includes:
a first D/A converter for generating a first reference voltage and a second reference voltage different to each other in voltage level according to upper m bit of digital input data of (m+n) bit;
a second D/A converter of R-2R ladder resistor type for converting the digital input data to an analog voltage value by using information of lower n bit of the digital input data and the first and second reference voltages so that the analog voltage value is within a range whose upper limit is a higher voltage level of the first reference voltage and the second reference voltage, and whose lower limit is a lower voltage level of the first reference voltage and the second reference voltage, the first reference voltage being supplied to respective input terminals on digital data input side of a ladder resistor-net in the second D/A converter when each bit of digital data of the lower n bit inputted to the second D/A converter has a first value, and the second reference voltage being inputted to the respective input terminals on the digital data input side of the ladder resistor-net in the second D/A converter when the bit of the digital data of the lower n bit sup lied to the second D/A converter has a second value,
controlling means for generating a control signal according to which of voltage levels of the first reference voltage and the second reference voltage is higher; and
inverting means for inputting the digital data of the lower n bit as such to the second D/A converter when the control signal shows that the first reference voltage is higher in voltage level than the second reference voltage, and inputting the digital data of the lower n bit to the second D/A converter by exchanging the first value and the second value of the digital data of the lower n bit when the control signal shows that the first reference voltage is lower in voltage level than the second reference voltage,
wherein the second D/A converter includes switching means for switching a voltage inputted to an input terminal of an offset level control resistor,
wherein the switching means includes switches of a CMOS transistor structure corresponding to a plurality of connection terminals different in voltage level so as to switch the voltage inputted to the input terminal of the offset level control resistor by carrying out connection and disconnection between the input terminal of the offset level control resistor and the connection terminals,
wherein the switches are related in a complemented manner of P-type and N-type; and
dummy switches made u of an N-type MOS transistor and a P-type MOS transistor having respective polarities that are provided parallel with each other, the dummy switches being provided parallel with a signal line having the switches and between the switches and the input terminal of the offset level control resistor, the P-type MOS transistor and the N-type MOS transistor each receiving a gate signal that is completely out of chase with a gate signal that is supplied to the MOS transistor of the switches having the same polarity.

10. A audio device, comprising:
a D/A converter circuit,
the D/A converter circuit includes:
a first D/A converter for generating a first reference voltage and a second reference voltage different to each other in voltage level according to upper m bit of digital input data of (m+n) bits;
a second D/A converter of R-2R ladder resistor type for converting the digital input data to an analog voltage value by using information of lower n bit of the digital input data and the first and second reference voltages so that the analog voltage value is within a range whose upper limit is a higher voltage level of the first reference voltage and the second reference voltage, and whose lower limit is a lower voltage level of the first reference voltage and the second reference voltage, the first reference voltage being supplied to respective input terminals on digital data input side of a ladder resistor-net in the second D/A converter when each bit of digital data of the lower n bit inputted to the second D/A converter has a first value, and the second reference voltage being inputted to the respective input terminals on the digital data input side of the ladder resistor-net in the second D/A converter when the bit of the digital data of the lower n bit supplied to the second D/A converter has a second value, controlling means for generating a control signal according to which of voltage levels of the first reference voltage and the second reference voltage is higher; and inverting means for inputting the digital data of the lower n bit as such to the second D/A converter when the control signal shows that the first reference voltage is higher in voltage level than the second reference voltage, and inputting the digital data of the lower n bit to the second D/A converter by exchanging the first value and the second value of the digital data of the lower n bit when the control signal shows that the first reference voltage is lower in voltage level than the second reference voltage, wherein the second D/A converter includes switching means for switching a voltage inputted to an input terminal of an offset level control resistor, wherein the switching means includes switches of a CMOS transistor structure corresponding to a plurality of connection terminals different in voltage level so as to switch the voltage inputted to the input terminal of the offset level control resistor by carrying out connection and disconnection between the input terminal of the offset level control resistor and the connection terminals, wherein the switches are operated in a complemented manner of P-type and N-type; and dummy switches made up of an N-type MOS transistor and a P-type MOS transistor having respective polarities that are provided parallel with each other, the dummy switches being provided parallel with a signal line having the switches and between the switches and the input terminal of the offset level control resistor, the P-type MOS transistor and the N-type MOS transistor each receiving a gate signal that is completely out of phase with a voltage signal that is supplied to the MOS transistor of the switches having the same polarity.

* * * * *